(12) United States Patent
Maeda et al.

(10) Patent No.: US 8,663,903 B2
(45) Date of Patent: Mar. 4, 2014

(54) TOP COATING COMPOSITION

(75) Inventors: Kazuhiko Maeda, Tokyo (JP);
Takamasa Kitamoto, Asaka (JP);
Haruhiko Komoriya, Iruma-gun (JP);
Satoru Narizuka, Saitama (JP);
Yoshimi Isono, Kawagoe (JP);
Kazunori Mori, Iruma-gun (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 13/264,285

(22) PCT Filed: Apr. 20, 2010

(86) PCT No.: PCT/JP2010/057007
§ 371 (c)(1),
(2), (4) Date: Oct. 13, 2011

(87) PCT Pub. No.: WO2010/123000
PCT Pub. Date: Oct. 28, 2010

(65) Prior Publication Data
US 2012/0040294 A1 Feb. 16, 2012

(30) Foreign Application Priority Data
Apr. 21, 2009 (JP) .................................. 2009-103451

(51) Int. Cl.
*G03F 7/11* (2006.01)
*C08F 20/22* (2006.01)

(52) U.S. Cl.
USPC .................. 430/271.1; 430/270.1; 430/273.1; 526/245; 526/292.1

(58) Field of Classification Search
USPC .................. 430/270.1, 271.1, 273.1; 526/245
See application file for complete search history.

(56) References Cited

U.S. PATENT DOCUMENTS

| | | | |
|---|---|---|---|
| 7,402,626 B2 | 7/2008 | Maeda et al. | |
| 7,887,990 B2 * | 2/2011 | Isono et al. | 430/270.1 |
| 2007/0122741 A1 | 5/2007 | Hatakeyama et al. | |
| 2008/0311507 A1 * | 12/2008 | Isono et al. | 430/270.1 |
| 2009/0011199 A1 | 1/2009 | Isono et al. | |
| 2009/0197204 A1 | 8/2009 | Shiono et al. | |
| 2010/0183976 A1 * | 7/2010 | Wang et al. | 430/270.1 |
| 2010/0304303 A1 * | 12/2010 | Maeda et al. | 430/286.1 |
| 2011/0098500 A1 | 4/2011 | Isono et al. | |
| 2011/0151378 A1 | 6/2011 | Matsumura et al. | |
| 2011/0212401 A1 | 9/2011 | Nishimura et al. | |
| 2012/0064459 A1 * | 3/2012 | Maeda et al. | 430/285.1 |

FOREIGN PATENT DOCUMENTS

| | | | | |
|---|---|---|---|---|
| JP | 2005-316352 A | 11/2005 | | |
| JP | 2007-316581 A | 12/2007 | | |
| JP | 2009-19199 A | 1/2009 | | |
| JP | 2009-29802 A | 2/2009 | | |
| JP | 2010-32994 A | 2/2010 | | |
| KR | 2010-0109621 A | 12/2008 | | |
| WO | WO 2009057769 A1 * | 5/2009 | ............ | C07C 309/12 |
| WO | WO 2009/142181 A1 | 11/2009 | | |
| WO | WO 2010/029982 A1 | 3/2010 | | |

OTHER PUBLICATIONS

Corresponding International Search Report with English Translation dated May 25, 2010 (five (5) pages).
Form PCT/ISA/237 (three (3) pages).
M. Switkes et al., "Resolution Enhancement of 157 nm Lithography by Liquid Immersion", Optical Microlithography XV, Anthony Yen, Editor, Proceedings of SPIE, vol. 4691, 2002, pp. 459-465.
Taku Hirayama,"Resist and Cover Material Investigation for Immersion Lithography", 2$^{nd}$ Immersion Workshop, Jul. 11, 2003, (sixteen (16) pages).
Korean Office Action dated Jun. 3, 2013 (Four (4) pages).

* cited by examiner

*Primary Examiner* — Cynthia H Kelly
*Assistant Examiner* — Anna Conlin
(74) *Attorney, Agent, or Firm* — Crowell & Moring LLP

(57) ABSTRACT

Disclosed is a top coating composition formed on a resist film, for protecting the resist film, the top coating composition being a top coating composition for photoresist, characterized by containing a fluorine-containing polymer having a repeating unit represented by the following general formula (1). This composition is capable of controlling developing solution solubility and has a high water repellency.

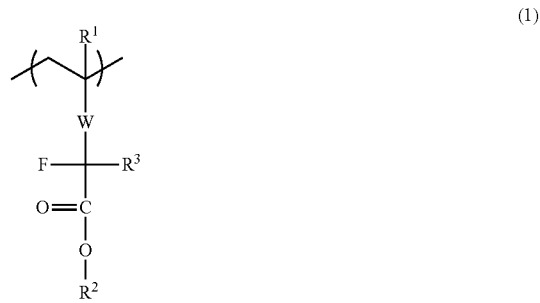

[In the formula, $R^1$ represents a hydrogen atom, fluorine atom, methyl group or trifluoromethyl group, $R^2$ represents a heat-labile protecting group, $R^3$ represents a fluorine atom or fluorine-containing alkyl group, and W is a bivalent linking group.]

7 Claims, No Drawings

TOP COATING COMPOSITION

TECHNICAL FIELD

The present invention relates to a photoresist top coating composition containing a fluorine-containing polymer having a special repeating unit. The top coating composition is useful as a protective film particularly in immersion exposure process.

BACKGROUND OF THE INVENTION

Fluorine-containing compounds are developed and used in a wide application field of advanced materials, due to properties owned by fluorine, such as water-repellent property, oil-repellent property, low water absorption, heat resistance, weather resistance, corrosion resistance, transparency, photosensitivity, low refractive index, low dielectricity, etc. Particularly recently, there have been active researches on resist materials of fluorine-containing compounds as novel materials having a high transparency to short wavelength ultraviolet rays such as $F_2$ laser and ArF excimer laser. A common molecular design in these application fields is based on the achievement of properties such as transparency at each wavelength used by introducing fluorine, photosensitivity utilizing acid properties of fluoroalcohol such as 1,1,1,3,3,3-hexafluoroisopropyl-2-hydroxy group (it may be referred to as hexafluoroisopropyl hydroxyl group), and adhesive property to the substrate.

On the other hand, together with the trend toward microscale device structure, there has been a demand for microscale resist pattern in lithography step, and the improvement of an exposure apparatus has been studied.

For example, stepper (reduced projection type exposure machine) has greatly been improved in resolution too by the improvement of performance of reduced projection lens and the improvement of optical system design. The performance of a lens used in stepper is expressed by NA (numerical aperture), and a value around 0.9 is said to be physical limit in the air. At present, it has already been achieved. Therefore, there has been an attempt to raise NA to 1.0 or greater by filling the space between lens and wafer with a medium having a refractive index higher than that of air. In particular, an exposure technique by an immersion procedure using pure water (hereinafter it may be referred to as simply water) as the medium has attracted attention (Non-patent Publication 1).

In immersion lithography, a resist film is brought into contact with the medium (e.g., water). Therefore, various problems have been pointed out. In particular, the pattern shape change caused by that an acid generated in the film by exposure or an amine compound added as quencher is dissolved in water, the pattern collapse caused by swelling, etc. becomes problems. Then, there has been a report that it is effective to form a top coating film on the resist to have a separation of the resist film and water (Non-patent Publication 2).

Therefore, the top coating composition is required to have properties such as a good developing solution solubility, resistance against pure water, separation of the resist film and water, no corrosion on the resist film of the underlayer, etc. As a top coating composition satisfying such requirement, there has been developed a composition containing a fluorine-containing polymer having a repeating unit containing a unit containing at least two hexafluoroisopropyl hydroxy groups, and there has been a report that it is superior particularly in developing solution solubility (Patent Publication 1).

Fluorine-containing resist composition is effective for improving water repellency. Hitherto, various fluorine-containing polymers for fluorine-containing resists have been developed. The present applicant discloses a difluoroacetic acid ester having a polymerizable double bond-containing group and an acid-labile protecting group (Patent Publication 2) and a difluoroacetic acid having a polymerizable double bond-containing group (Patent Publication 3).

PRIOR ART PUBLICATIONS

Patent Publications

Patent Publication 1: Japanese Patent Application Publication 2005-316352
Patent Publication 2: Japanese Patent Application Publication 2009-19199
Patent Publication 3: Japanese Patent Application Publication 2009-29802

Non-Patent Publications

Non-patent Publication 1: Proceedings of SPIE (((country of publication) United States) 2002, vol. 4691, pages 459-465).
Non-patent Publication 2: $2^{nd}$ Immersion Work Shop, Jul. 11, 2003, Resist and Cover Material Investigation for Immersion Lithography)

SUMMARY OF THE INVENTION

In a top coating composition that is formed on a resist film and protects the resist film, it is required to have properties such as a good developing solution solubility, resistance against pure water, separation of the resist film and water, water repellency, no corrosion on the resist film of the underlayer, etc.

In case that developing solution solubility is inferior, the removal of the top coating film becomes insufficient, resulting in deterioration of photoresist properties. Therefore, it is not preferable. In contrast, in case that developing solution solubility is too high, it is also possible to cause film loss of the resist layer of the underlayer. Therefore, one showing an appropriate developing solution solubility is preferable.

Furthermore, it is required to have maintenance of water between lens and substrate in an immersion exposure machine and a water-repellent surface for the purpose of not leaving water drops on the surface upon scanning. Water drops cause the formed resist pattern to have defects. As a countermeasure against this, it is proposed to form a top coating layer having a high water repellency on the resist.

Water repellency necessary on scanning can be evaluated mainly by receding contact angle. In order to have less defects of a fine pattern formed on the resist, it is preferable to have a receding contact angle of 70° or greater, more preferably 75° or greater. It is very difficult to achieve both control of developing solution solubility and a high water repellency (receding contact angle).

A top coating composition described in Patent Publication 1 provides a useful top coating superior in developing solution solubility. Due to being too high in solubility, it is not necessarily appropriate in case that a fine solubility control is necessary. Thus, there has been a demand for a top coating composition having a suitable solubility.

Furthermore, the composition described in Patent Publication 1 is insufficient in water repellency in case that exposure is conducted by a high-speed scanning type immersion exposure machine, and there has been a problem to cause defects on the formed image by the effect of water drops remaining on the surface. Furthermore, in the production too, it is a burden in terms of cost, too, to introduce two hexafluoroisopropyl hydroxy groups, and there has been a demand for a top coating composition that satisfies the above properties by a composition with a lower cost.

Besides, hexafluoroisopropyl hydroxy group is represented by the following structure, has a high fluorine content, and attracts attention as a unit having a hydroxy group, which is a polar group, in the same molecule.

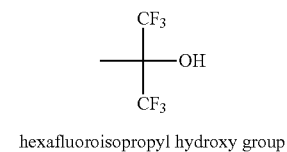

hexafluoroisopropyl hydroxy group

When the present inventors studied the introduction of fluorine atom into a resin composition in order to improve water repellency of the top coating, we found that the introduction of fluorine atom to α-position of carbonyl group of ester group makes it possible to greatly improve water repellency and to obtain a high receding contact angle. More surprisingly, we found that the introduction of the structure into a resin composition makes it possible to easily release the protecting group of carboxylic acid by a heat treatment and that, since the heat treatment as a turning point makes solubility in the developing solution increase greatly, control of developing solution solubility can be made by heat, thereby completing the present invention.

That is, a top coating composition for photoresist, which is characterized by containing a fluorine-containing polymer having a repeating unit represented by general formula (1), can be applied on a film formed of a resist resin and makes it possible to conduct a high-speed scanning by an immersion exposure machine due to having a high water repellency, thereby improving productivity. Furthermore, it is possible to greatly increase solubility in the developing solution by conducting the development after the heat treatment, and thereby to reduce defects of resist pattern.

The present invention makes it possible to control developing solution solubility by heat treatment and thereby makes it possible to introduce a component superior in water repellency into a resin component. Therefore, it is an epoch-making invention by which both control of developing solution solubility and high water repellency have been achieved, although they were contradictory so far.

That is, the present invention contains the following Invention 1 to Invention 10.

[Invention 1]

A top coating composition formed on a resist film, for protecting the resist film, the top coating composition being a top coating composition for photoresist, characterized by containing a fluorine-containing polymer having a repeating unit represented by the following general formula (1).

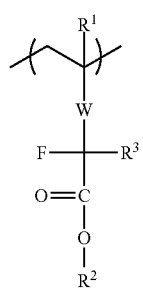

(1)

[In the formula, $R^1$ represents a hydrogen atom, fluorine atom, methyl group or trifluoromethyl group, $R^2$ represents a heat-labile protecting group, $R^3$ represents a fluorine atom or fluorine-containing alkyl group, and W is a bivalent linking group.]

[Invention 2]

A top coating composition of Invention 1, which is characterized by that the fluorine-containing polymer is a fluorine-containing polymer in which $R^3$ is a fluorine atom or $C_{1-3}$ fluorine-containing alkyl group.

[Invention 3]

A top coating composition of Invention 1 or 2, which is characterized by that the fluorine-containing polymer is a fluorine-containing polymer having a repeating unit represented by any one of the following general formulas (1-1) to (1-4).

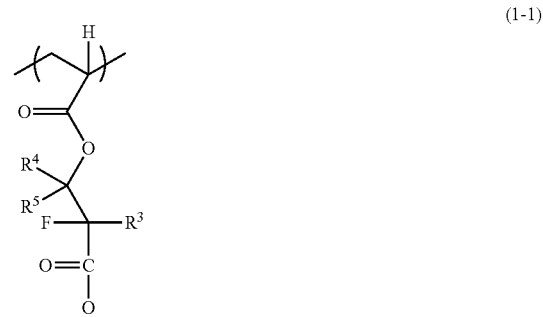

(1-1)

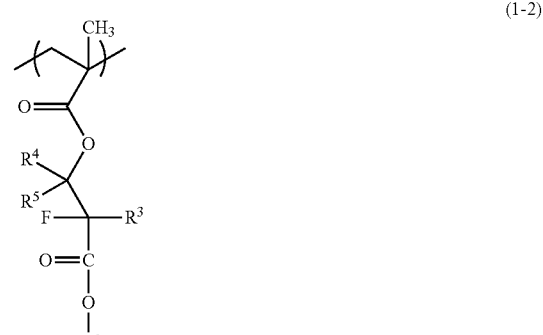

(1-2)

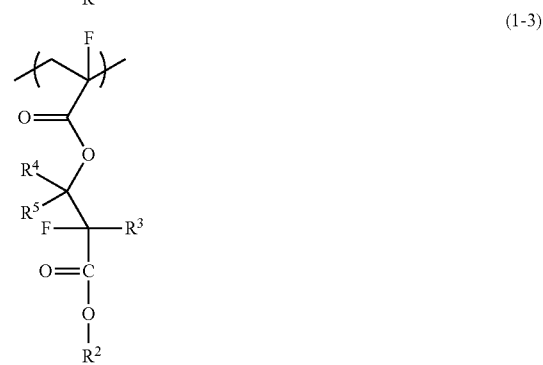

(1-3)

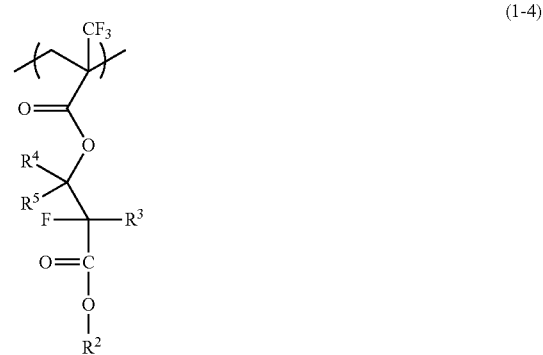

(1-4)

(In the formula, $R^2$ represents a heat-labile protecting group, $R^3$ represents a fluorine atom or trifluoromethyl group, $R^4$ represents a hydrogen atom, or a straight-chain, branched or cyclic alkyl group or fluoroalkyl group, $R^5$ represents a straight-chain, branched or cyclic alkyl group or fluoroalkyl group, and $R^4$ and $R^5$ may be bonded to each other to form a ring.)

[Invention 4]

A top coating composition of Invention 3, wherein the fluorine-containing polymer is a fluorine-containing polymer in which $R^2$ is 1-methylcyclopentyl group or 1-ethylcyclopentyl group, $R^3$ is a fluorine atom, $R^4$ is a hydrogen atom, and $R^5$ is a lower alkyl group.

[Invention 5]

A top coating composition of any one of Inventions 1-4, wherein the fluorine-containing polymer is a fluorine-containing polymer having a repeating unit obtained by a cleavage of a polymerizable double bond of a polymerizable monomer having a hexafluoroisopropyl hydroxyl group.

[Invention 6]

A top coating composition, which is characterized by that a top coating composition of any one of Inventions 1-5 further comprises an organic solvent.

[Invention 7]

A top coating composition of Invention 6, wherein the organic solvent is a solvent comprising one or at least two solvents selected from the group consisting of $C_{5-20}$ cyclic or chain hydrocarbons, $C_{1-20}$ alcohols, and the cyclic or chain hydrocarbons partially replaced with fluorine.

[Invention 8]

A pattern forming method, which is characterized by comprising the step of applying a top coating composition of Invention 5 or 6 on a resist film; the step of conducting an exposure with a high-energy ray having a wavelength of 300 nm or shorter through a photomask; and the step of conducting a development by using a developing solution after a heating treatment.

[Invention 9]

A pattern forming method of Invention 8, which is characterized by that the heating treatment after the exposure is conducted at 60° C. to 170° C.

[Invention 10]

A pattern forming method of Invention 8 or 9, which is characterized by being an immersion lithography method in which an Ar excimer laser having a wavelength of 193 nm is used, and in which water is inserted between wafer and projector lens.

DETAILED DESCRIPTION

A photoresist top coating composition according to the present invention can be applied on the resist film. Furthermore, since it has a high water repellency, it enables a high-speed scanning by an immersion exposure machine. Therefore, it can improve productivity. Furthermore, solubility in the developing solution can be increased greatly by a heat treatment, and it is possible to reduce defects of resist pattern.

A photoresist top coating composition of the present invention is a top coating composition, which is formed on a resist film and protects the resist film, and is a photoresist top coating composition, which is characterized by containing a fluorine-containing polymer having a repeating unit represented by the following general formula (1).

A fluorine-containing polymer having a repeating unit represented by general formula (1) of the present invention has a repeating unit formed of a main chain made up of a chain skeleton formed on the basis of a polymerizable double bond, and a side chain wherein one fluorine atom and a fluorine atom or fluorine-containing alkyl group are bonded to a carbon atom at α-position and wherein a carboxy group of which hydroxy group has been protected with a heat-labile protecting group $R^2$ is bonded through a linking group W.

In the present specification, "lower" refers to a $C_{1-4}$ chain skeleton and refers to a $C_{3-12}$ cyclic skeleton.

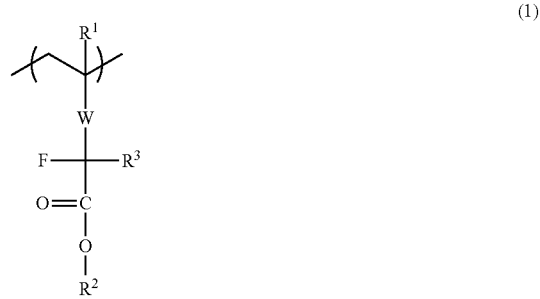

(1)

<Fluorine-Containing Polymer>

The fluorine-containing polymer having a repeating unit represented by general formula (1) is a resin of which rate of dissolution in an alkali developing solution increases by an action of heat or acid, and has a group (decomposable group) that decomposes by an action of heat or acid to become alkali-soluble. Although the decomposable group of the fluorine-containing polymer of the present invention decomposes by heat or acid, it refers to a heat-decomposable group since a control by heat treatment is basic in the present specification. Of the heat-decomposable group, a leaving moiety refers to a heat-labile protecting group.

Since the above heat-decomposable group moiety is also capable to decomposing by an action of acid, it is also possible to use a photoacid generator or heat acid generator used in the common resist development. Under an action of acid generator, a heat decomposable group or heat-labile protecting group referred to in the present specification can be read as an acid decomposable group or acid-labile protecting group.

$R^1$ is a hydrogen atom, fluorine atom, methyl group or trifluoromethyl group. $R^3$ is a fluorine atom or fluorine-containing alkyl group. Such fluorine-containing alkyl group is not particularly limited, but it is one having a carbon number of 1-12, preferably one having a carbon number of 1-3. It is possible to mention trifluoromethyl group, pentafluoroethyl group, 2,2,2-trifluoroethyl group, n-heptafluoropropyl group, 2,2,3,3,3-pentafluoropropyl group, 3,3,3-trifluoropropyl group, hexafluoroisopropyl group, etc. As $R^3$, a fluorine atom or trifluoromethyl group is more preferable.

As a heat-labile protecting group represented by $R^2$, it is possible to cite the followings.

$R^{11}$—O—C(=O)— (L-1)

$R^{11}$—O—CHR$^{12}$— (L-2)

CR$^{13}$R$^{14}$R$^{15}$— (L-3)

SiR$^{13}$R$^{14}$R$^{15}$— (L-4)

$R^{11}$—C(=O)— (L-5)

$R^{11}$, $R^{12}$, $R^{13}$, $R^{14}$ and $R^{15}$ represent monovalent organic groups explained in the following. Of these, (L-1), (L-2) and (L-3) function as a chemically amplified type and therefore are particularly preferable to be used in a resist composition applied to a pattern forming method with a high-energy ray exposure.

$R^{11}$ represents an alkyl group, alicyclic hydrocarbon group, or aryl group (aromatic hydrocarbon group). $R^{12}$ represents a hydrogen atom, alkyl group, alicyclic hydrocarbon group, alkenyl group, aralkyl group, alkoxy group, or aryl group. $R^{13}$, $R^{14}$ and $R^{15}$ may be the same or different and represent alkyl groups, alicyclic hydrocarbon groups, alkenyl groups, aralkyl groups, or aryl groups. Furthermore, two groups of $R^{13}$ to $R^{15}$ may be combined to form a ring.

Herein, the alkyl group is preferably one having a carbon number of 1-4, such as methyl group, ethyl group, propyl group, isopropyl group, n-butyl group, sec-butyl group, and tert-butyl group. As the alicyclic hydrocarbon group, it is possible to cite one having a carbon number of 3-30. Specifically, cyclopropyl group, cyclopentyl group, cyclohexyl group, adamantyl group, norbornyl group, bornyl group, tricyclodecanyl group, dicyclopentenyl group, norbornaneepoxy group, menthyl group, isomenthyl group, neomenthyl group, tetracyclododecanyl group, steroid residue, etc. are preferable. The alkenyl group is preferably one having a carbon number of 2-4, such as vinyl group, propenyl group, allyl group, and butenyl group. The aryl group is preferably one having a carbon number of 6-14, such as phenyl group, xylyl group, tolyl group, cumenyl group, naphthyl group, and antracenyl group, and these may have substituents. As the aralkyl group, it is possible to cite one having a carbon number of 7-20, optionally having a substituent. It is possible to cite benzyl group, phenethyl group, cumyl group, etc.

Furthermore, as the substituents further possessed by the organic groups represented by the above $R^{11}$, $R^{12}$, $R^{13}$, $R^{14}$ and $R^{15}$, it is possible to cite hydroxy group, halogen atoms, nitro group, cyano group, the above alkyl groups or alicyclic hydrocarbon groups, alkoxy groups such as methoxy group, ethoxy group, hydroxyethoxy group, propoxy group, hydroxypropoxy group, n-butoxy group, isobutoxy group, sec-butoxy group and tert-butoxy group, alkoxycarbonyl groups such as methoxycarbonyl group and ethoxycarbonyl group, aralkyl groups such as benzyl group, phenethyl group and cumyl group, acyl groups such as aralkyloxy group, formyl group, acetyl group, butyryl group, benzoyl group, cyanamyl group and valeryl group, acyloxy groups such as butyloxy group, the above alkenyl groups, alkenyloxy groups such as vinyloxy group, propenyloxy group, allyloxy group and butenyloxy group, the above aryl groups, aryloxy groups such as phenoxy group, and aryloxycarbonyl groups such as benzoyloxy group.

Furthermore, it is possible to cite lactone groups represented by the following formula (3-1) and formula (3-2).

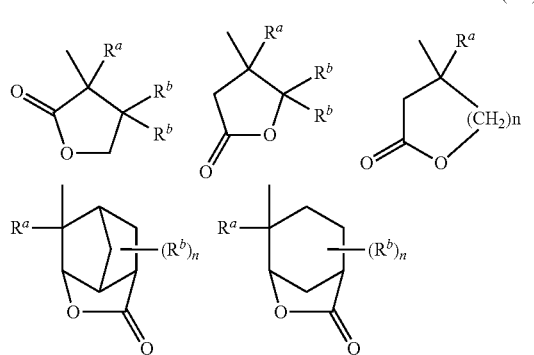

(3-1)

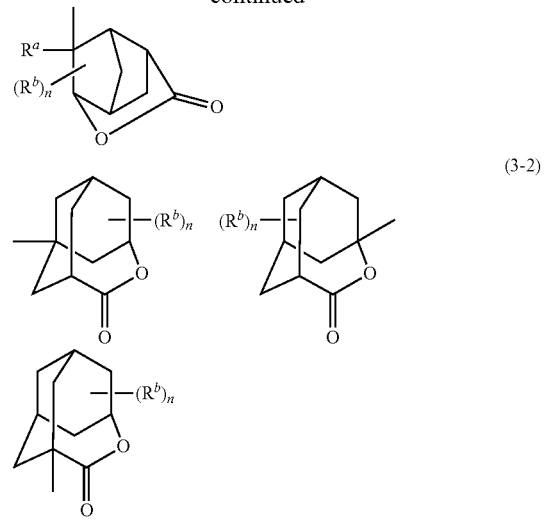

(3-2)

In the above formulas, $R^a$ represents a $C_1$-$C_4$ alkyl group or perfluoroalkyl group. Each of $R^b$'s independently represents a hydrogen atom, $C_1$-$C_4$ alkyl group or perfluoroalkyl group, hydroxy group, carboxylic acid group, alkyloxycarbonyl group, alkoxy group, etc., and n represents an integer of 1-4.

Next, the above heat-labile protecting group is specifically shown. These are particularly preferable examples. Of these, examples exemplarily shown as tertiary hydrocarbon groups represented by $CR^{13}R^{14}R^{15}$- are more preferable.

The alkoxycarbonyl group represented by the above $R^{11}$—O—C(=O)— can be exemplified by tert-butoxycarbonyl group, tert-amyloxycarbonyl group, methoxycarbonyl group, ethoxycarbonyl group, i-propoxycarbonyl group, cyclohexyloxycarbonyl group, isobornyloxycarbonyl group, adamantaneoxycarbonyl group, etc.

As the acetal group represented by the above $R^{11}$—O—$CHR^{12}$—, it is possible to cite methoxymethyl group, ethoxymethyl group, 1-ethoxyethyl group, 1-butoxyethyl group, 1-isobutoxyethyl group, 1-cyclohexyloxyethyl group, 1-benzyloxyethyl group, 1-phenethyloxyethyl group, 1-ethoxypropyl group, 1-benzyloxypropyl group, 1-phenethyloxypropyl group, 1-ethoxybutyl group, 1-cyclohexyloxyethyl group, 1-ethoxyisobutyl group, 1-methoxyethoxymethyl group, tetrahydropyranyl group, tetrahydrofuranyl group, etc. Furthermore, it is possible to cite acetal groups obtained by adding vinyl ethers to hydroxy group.

The tertiary hydrocarbon group represented by the above $CR^{13}R^{14}R^{15}$— can be exemplified by tert-butyl group, tert-amyl group, 1,1-dimethylpropyl group, 1-ethyl-1-methylpropyl group, 1,1-dimethylbutyl group, 1-ethyl-1-methylbutyl group, 1,1-diethylpropyl group, 1,1-dimethyl-1-phenylmethyl group, 1-methyl-1-ethyl-1-phenylmethyl group, 1,1-diethyl-1-phenylmethyl group, 1-methylcyclohexyl group, 1-ethylcyclohexyl group, 1-methylcyclopentyl group, 1-ethylcyclopentyl group, 1-isobornyl group, 1-methyladamantyl group, 1-ethyladamantyl group, 1-isopropyladamantyl group, 1-isopropylnorbornyl group, and 1-isopropyl-(4'-methylcyclohexyl) group, etc.

Next, specific examples of the alicyclic hydrocarbon group or the heat-labile protecting group containing an alicyclic hydrocarbon group are further shown.

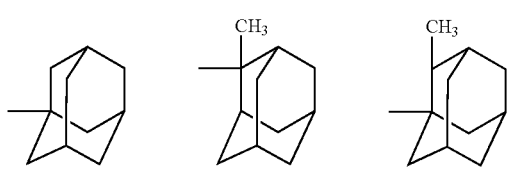
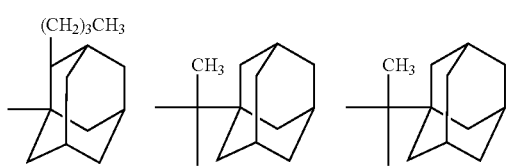
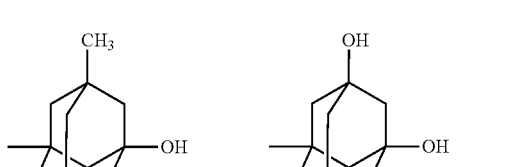
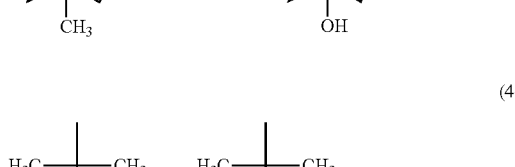

(4-1)

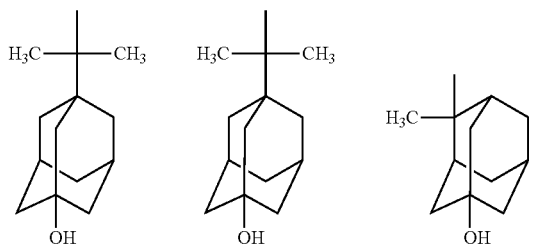
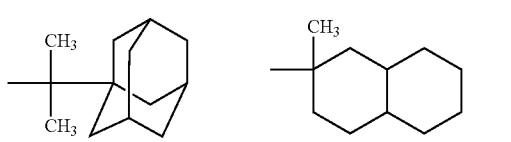
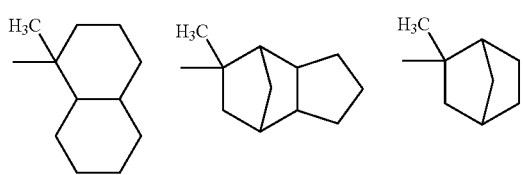
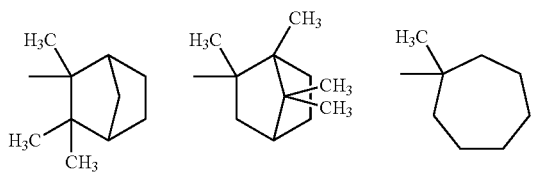
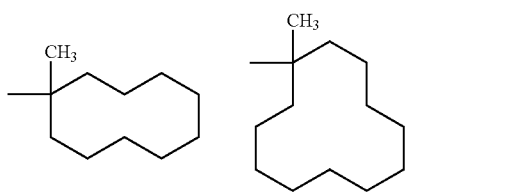

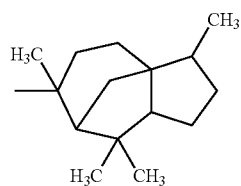

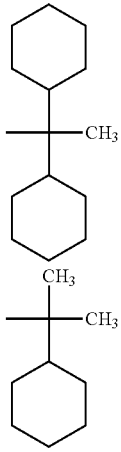

(4-2)

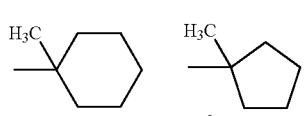
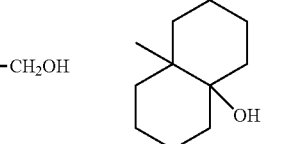
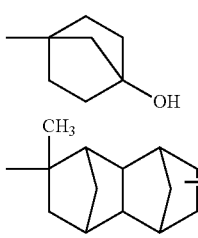
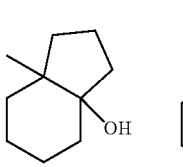
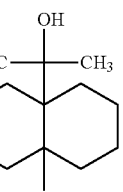
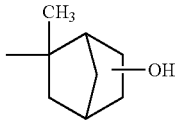

In the formulas of (4-1) and (4-2), each methyl group ($CH_3$) may independently be an ethyl group. Furthermore, as mentioned above, one or at least two of ring carbons can have a substituent.

As the silyl group represented by the above $SiR^{13}R^{14}R^{15}$—, it is possible to cite, for example, trimethylsilyl group, ethyldimethylsilyl group, methyldiethylsilyl group, triethylsilyl group, i-propyldimethylsilyl group, methyldi-i-propylsilyl group, tri-i-propylsilyl group, tert-butyldimethylsilyl group, methyldi-tert-butylsilyl group, tri-tert-butylsilyl group, phenyldimethylsilyl group, methyldiphenylsilyl group, triphenylsilyl group, etc.

As the acyl group represented by the above $R^{11}$—C(=O)—, it is possible to cite acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, etc. Furthermore, it is also possible to use ones in which fluorine atoms have been substituted for a part or entirety of hydrogen atoms of these heat-labile protecting groups.

Furthermore, the heat-labile protecting group containing a lactone group is exemplified by the following formula (5), formula (6) and formula (7).

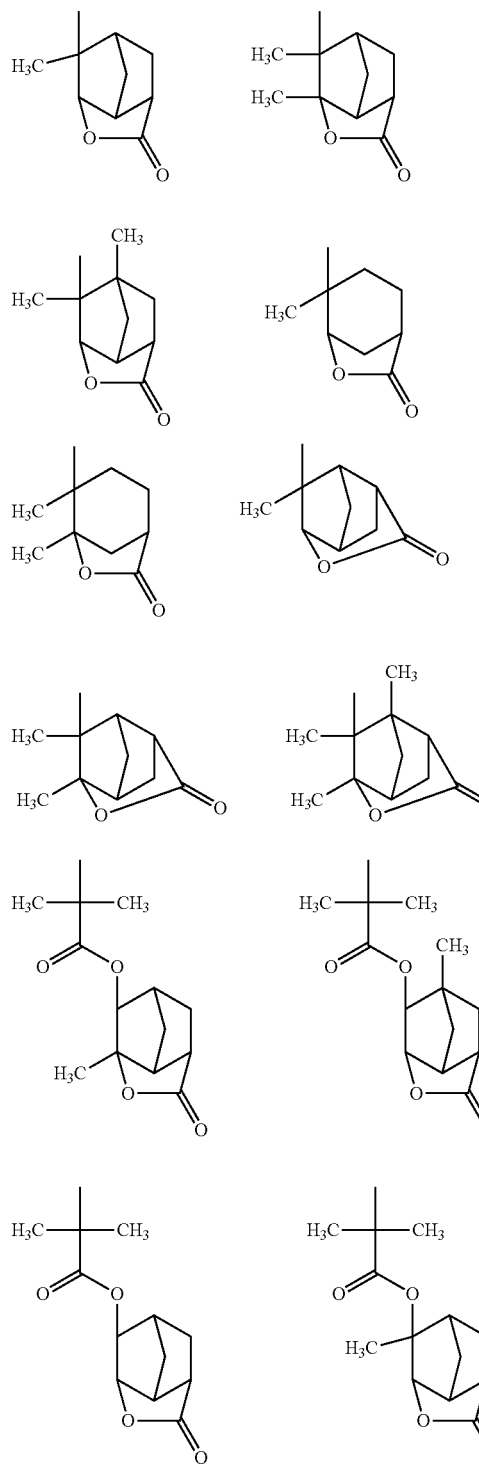

(5)

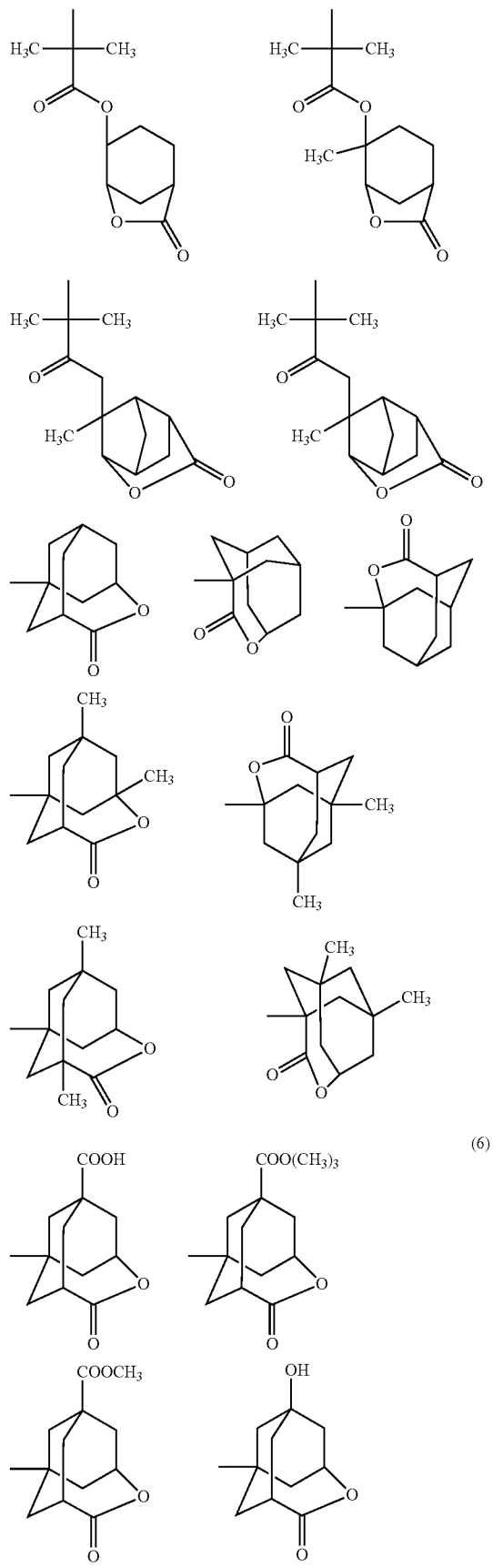

(6)

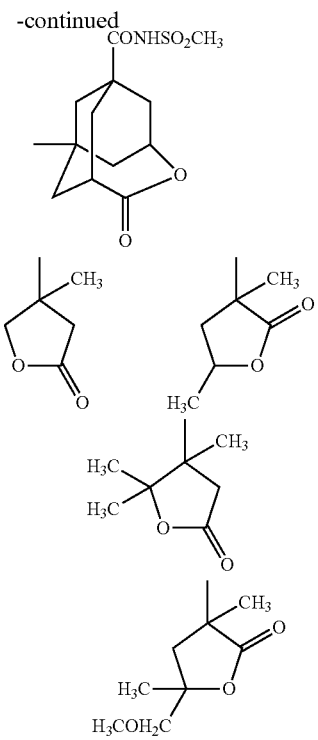

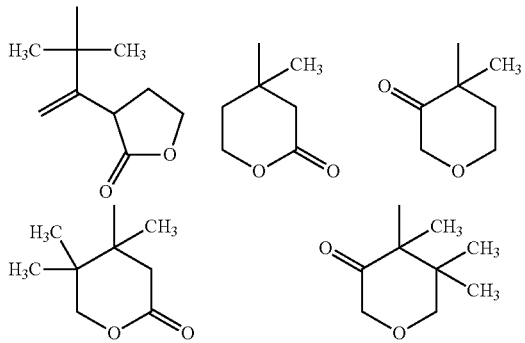

(7)

In the formulas of formula (5), formula (6) and formula (7), each methyl group ($CH_3$) may independently be an ethyl group.

As the heat-labile protecting group, it is possible to cite as preferable ones tertiary alkyl groups such as tert-butyl group and tert-amyl group, alkoxyethyl groups such as 1-ethoxyethyl group, 1-butoxyethyl group, 1-isobutoxyethyl group and 1-cyclohexyloxyethyl group, and alkoxymethyl groups such as methoxymethyl group and ethoxymethyl group, and the above-mentioned alicyclic hydrocarbon groups such as adamantyl group and isobornyl group, or heat-labile protecting groups having a tertiary carbon containing an alicyclic hydrocarbon group, lactones, etc.

The linking group W is a bivalent linking group having a main skeleton formed of a single or a combination of at least two groups selected from the group consisting of a single bond, an unsubstituted or substituted methylene group, a bivalent cyclic alkylene group (alicyclic hydrocarbon group), a bivalent arylene group (aromatic hydrocarbon group), a substituted or unsubstituted condensed polycyclic aromatic group, a bivalent heterocyclic group, ether group (—O—), carbonyl group, oxocarbonyl group, thioether bond (—S—), amide bond (—C(=O)NH—), sulfonamide bond (—S(=O)NH), and urea bond (—NH—C(=O)NH—). The linking group W may contain a plurality of the same group of the above. Arbitrary number of hydrogen atoms bonded to the carbon atoms may be replaced with fluorine atoms. In the linking group, each carbon atom may form a ring by including a substituent.

A substituted methylene group constituting a main skeleton of the linking group W is represented by the following general formula (2).

$$—CR^4R^5—\qquad(2)$$

Herein, a monovalent group represented by $R^4$ or $R^5$ of the substituted methylene group is not particularly limited, but it is a hydrogen atom, halogen atom, hydroxy group, or a $C_1$-$C_{30}$ monovalent organic group selected from substituted or unsubstituted alkyl groups, substituted or unsubstituted alicyclic hydrocarbon groups, alkoxy groups, substituted or unsubstituted aryl groups, and substituted or unsubstituted condensed polycyclic aromatic groups. These monovalent groups can have fluorine atom, oxygen atom, sulfur atom, nitrogen atom, or carbon-carbon double bond. $R^4$ and $R^5$ may be the same or different. $R^4$ and $R^5$ may be combined together with atoms in the molecule to form a ring. This ring is preferably an alicyclic hydrocarbon structure. As a monovalent organic group represented by $R^4$ or $R^5$, the following ones are cited.

As an acyclic alkyl group in $R^4$ and $R^5$, it is one having a carbon atom number of 1-30, preferably one having a carbon atom number of 1-12. It is possible to cite, for example, methyl group, ethyl group, n-propyl group, i-propyl group, n-butyl group, 1-methylpropyl group, 2-methylpropyl group, tert-butyl group, n-pentyl group, i-pentyl group, 1,1-dimethylpropyl group, 1-methylbutyl group, 1,1-dimethylbutyl group, n-hexyl group, n-heptyl group, i-hexyl group, n-octyl group, ioctyl group, 2-ethylhexyl group, n-nonyl group, n-decyl group, n-undecyl group, n-dodecyl group, etc. Lower alkyl groups are preferable. As particularly preferable ones, it is possible to cite methyl group, ethyl group, n-propyl group, i-propyl group, etc.

As an acyclic substituted alkyl group in $R^4$ and $R^5$, it is possible to cite ones in which one or at least two of hydrogen atoms possessed by the alkyl group have been replaced with a $C_3$-$C_{20}$ alicyclic hydrocarbon group, a $C_1$-$C_4$ alkoxy group, halogen atom, acyl group, acyloxy group, cyano group, hydroxy group, carboxy group, alkoxycarbonyl group, nitro group, or the like. An alkyl group having an alicyclic hydrocarbon group as the substituent can be exemplified by substituted alkyl groups such as cyclobutylmethyl group, cyclopentylmethyl group, cyclohexylmethyl group, cycloheptylmethyl group, cyclooctylmethyl group, norbornylmethyl group and adamantylmethyl group, and substituted alkyl groups in which hydrogen atom of these cyclic carbons has been replaced with methyl group, ethyl group or hydroxy group. Specifically, it is possible to preferably cite lower fluoroalkyl groups such as trifluoromethyl group, pentafluoroethyl group, 2,2,2-trifluoroethyl group, n-heptafluoropropyl group, 2,2,3,3,3-pentafluoropropyl group, 3,3,3-trifluoropropyl group and hexafluoroisopropyl group, as a fluoroalkyl group having fluorine atoms substituted therefor.

Alicyclic hydrocarbon groups in $R^4$ and $R^5$ or alicyclic hydrocarbon groups formed by including carbon atoms to which they are bonded may be monocyclic or polycyclic. Specifically, it is possible to cite groups having monocyclo, bicyclo, tricyclo, tetracyclo structures, etc. of a carbon number of at least 3. The carbon atom number is preferably 3-30, and particularly the carbon number is preferably 3-25. These alicyclic hydrocarbon groups may have substituents.

The monocyclic group is preferably one having a ring carbon number of 3-12, more preferably one having a ring carbon number of 3-7. For example, it is possible to cite as preferable ones cyclopropyl group, cyclobutyl group, cyclopentyl group, cyclohexyl group, cycloheptyl group, cyclooctyl group, cyclodecanyl group, cyclododecanyl group, and 4-tert-butylcyclohexyl group. Furthermore, it is possible to cite as the polycyclic group adamantyl group, noradamantyl group, decaline residue, tricyclodecanyl group, tetracyclododecanyl group, norbornyl group, cedrol group, etc. of a ring carbon number of 7-15. The alicyclic hydrocarbon group may be a Spiro ring, preferably a spiro ring of a carbon number of 3-6. Preferably, they are adamantyl group, decaline residue, norbornyl group, cedrol group, cyclohexyl group, cycloheptyl group, cyclooctyl group, cyclodecanyl group, cyclododecanyl group, tricyclodecanyl group, etc. It is possible to cite monocyclic groups in which one or at least two hydrogen atoms of the ring carbons or linking group of these organic groups have respectively independently been replaced with the above $C_{1-30}$ alkyl group or substituted alkyl group, hydroxy group, alkoxy group, carboxy group, alkoxycarbonyl group, or a group in which one or at least two hydrogen atoms contained in those have been replaced with fluorine atom or trifluoromethyl group.

Herein, the $C_{1-30}$ alkyl group is preferably a lower alkyl group, more preferably an alkyl group selected from the group consisting of methyl group, ethyl group, propyl group, and isopropyl group. Furthermore, as the substituent of the substituted alkyl group, it is possible to cite hydroxy group, halogen atom or alkoxy group. As the alkoxy group, it is possible to cite one having a carbon number of 1-4, such as methoxy group, ethoxy group, propoxy group, butoxy group, etc. As the alkoxycarbonyl group, it is possible to cite methoxycarbonyl group, ethoxycarbonyl group, and isopropoxycarbonyl group.

As the alkoxy group in $R^4$ and $R^5$, it is possible to cite one having a carbon number of 1-4, such as methoxy group, ethoxy group, propoxy group, butoxy group, etc.

The substituted or unsubstituted aryl group in $R^4$ and $R^5$ is one having a carbon number of 1-30. As a monocyclic group, one having a ring carbon number of 3-12 is preferable, and one having a ring carbon number of 3-6 is more preferable. It is possible to cite, for example, phenyl group, biphenyl group, terphenyl group, o-tolyl group, m-tolyl group, p-tolyl group, p-hydroxyphenyl group, p-methoxyphenyl group, mesityl group, o-cumenyl group, 2,3-xylyl group, 2,4-xylyl group, 2,5-xylyl group, 2,6-xylyl group, 3,4-xylyl group, 3,5-xylyl group, o-fluorophenyl group, m-fluorophenyl group, p-fluorophenyl group, o-trifluoromethylphenyl group, m-trifluoromethylphenyl group, p-trifluoromethylphenyl group, 2,3-bistrifluoromethylphenyl group, 2,4-bistrifluoromethylphenyl group, 2,5-bistrifluoromethylphenyl group, 2,6-bistrifluoromethylphenyl group, 3,4-bistrifluoromethylphenyl group, 3,5-bistrifluoromethylphenyl group, p-chlorophenyl group, p-bromophenyl group, p-iodophenyl group, etc.

As the substituted or unsubstituted $C_{1-30}$ condensed polycyclic aromatic group, it is possible to cite monovalent organic groups obtained by removing one hydrogen atom from pentalene, indene, naphthalene, azlene, heptalene, biphenylene, indacene, acenaphthylene, fluorene, phenarene, phenanthrene, anthracene, fluoranthene, acephenanthrylene, aceanthrylene, triphenylene, pyrene, chrysene, naphthacene, picene, perylene, pentaphene, pentacene, tetraphenylene, hexaphene, hexacene, rubicene, coronene, trinaphthylene, heptaphene, heptacene, pyranthrene, ovalene, etc. As preferable ones, it is possible to cite ones in which one or at least two hydrogen atoms of these have been replaced with fluorine atoms or $C_{1-4}$ alkyl groups or fluorine-containing alkyl groups.

As the monocyclic or polycyclic, heterocyclic group having a ring atom number of 3-25, it is possible to cite, for example, pyridyl group, furyl group, thienyl group, pyranyl group, pyrrolyl group, thiantrenyl group, pyrazolyl group, isothiazolyl group, isoxazolyl group, pyrazinyl group, pyrimidinyl group, pyridadinyl group, tetrahydropyranyl group, tetrahydrofuranyl group, tetrahydrothiopyranyl group, tetrahydrothiofuranyl group, 3-tetrahydrothiophen-1,1-dioxide group, etc., and heterocyclic groups in which one or at least two hydrogen atoms constituting these rings have been replaced with alkyl groups, alicyclic hydrocarbon groups, aryl groups or heterocyclic groups. Furthermore, ones having a monocyclic or polycyclic ether ring or lactone ring are preferable, and are exemplified by the following.

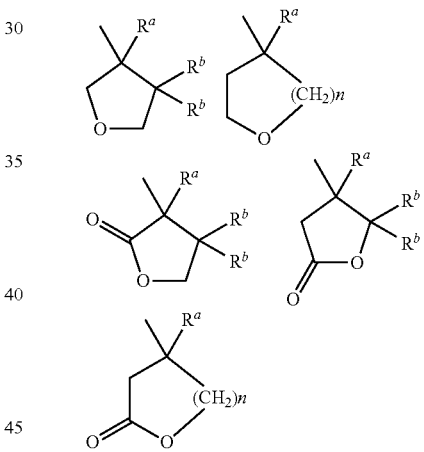

In the formula, each of $R^a$ and $R^b$ independently represents a hydrogen atom or $C_{1-4}$ alkyl group, and n represents an integer of 2-4.

The bivalent alicyclic hydrocarbon group constituting a main skeleton of the linking group W may be monocyclic or polycyclic. Specifically, it is possible to cite a group having a monocyclo, bicyclo, tricyclo, tetracyclo structure, etc. having a carbon number of at least 3. The carbon number is preferably 3-30, and particularly a carbon number of 3-25 is preferable. These alicyclic hydrocarbon groups may have substituents.

The monocyclic group is preferably one having a ring carbon number of 3-12, and one having a ring carbon number of 3-7 is more preferable. For example, as preferable ones, it is possible to cite cyclopropylene group, cyclobutylene group, cyclopentylene group, cyclohexylene group, cycloheptylene group, cyclooctylene group, cyclodecanylene group, cyclododecanylene group, and 4-tert-butylcyclohexylene group. Furthermore, as the polycyclic group, it is possible to cite adamantylene group, noradamantylene group, a divalent residue of decalin, tricyclodecanylene group, tetracyclododecanylene group, norbornylene group, and a divalent residue of cedrol. The alicyclic hydrocarbon group may be a spiro ring, and on that occasion a spiro ring having a carbon number of 3-6 is preferable. Furthermore, it is possible to cite ones in which one or at least two of hydrogen atoms of the ring carbons or linking groups of these organic groups are independently be replaced, as explained about $R^4$ or $R^5$, with a $C_{1-30}$ alkyl group or substituted alkyl group, hydroxy group, alkoxy group, carboxy group, alkoxycarbonyl group, or one in which one or at least two hydrogen atoms of those have been replaced with fluorine atom or trifluoromethyl group.

Herein, the $C_{1-30}$ alkyl group is preferably a lower alkyl group, more preferably an alkyl group selected from the group consisting of methyl group, ethyl group, propyl group, and isopropyl group. As a substituent of the substituted alkyl group, it is possible to cite hydroxy group, halogen atom and alkoxy group. As the alkoxy group, it is possible to cite one having a carbon number of 1-4, such as methoxy group, ethoxy group, propoxy group, butoxy group, etc. As the alkoxycarbonyl group, it is possible to cite methoxycarbonyl group, ethoxycarbonyl group, and isopropoxycarbonyl group.

Specifically, the linking group W is:
— (a single bond)
—O—
—C(=O)—O—
—CH$_2$—O—
—O—CH$_2$—
—CH$_2$—C(=O)—O—
—C(=O)—O—CH$_2$—
—CH$_2$—O—CH$_2$—
—CH$_2$—C(=O)—O—CH$_2$—, etc., and
—C(=O)—O—CR$^4$R$^5$—, or —C$_6$H$_4$—O—CR$^4$R$^5$—.
Herein, one in which each of $R^4$ and $R^5$ is independently a hydrogen atom, fluorine atom, alkyl group, substituted alkyl group, or alicyclic hydrocarbon group is preferable. These may be ones in which at least one hydrogen atom has been replaced with fluorine atom. Of these, it is possible to cite as a more preferable one —C(=O)—O—CR$^4$R$^5$— where each of $R^4$ and $R^5$ is independently a hydrogen atom or a lower alkyl group.

By showing the most preferable examples of a repeating unit represented by general formula (1), a fluorine-containing polymer having this repeating unit is shown, but this does not limit the present invention.

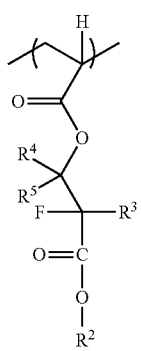

(1-1)

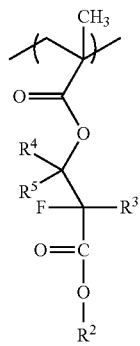

(1-2)

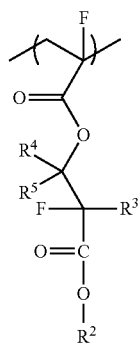

(1-3)

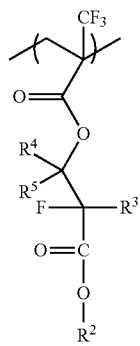

(1-4)

(In the formula, $R^2$ represents a heat-labile protecting group, $R^3$ represents a fluorine atom or trifluoromethyl group, $R^4$ represents a hydrogen atom, or a straight-chain, branched or cyclic alkyl group or fluoroalkyl group, $R^5$ represents a straight-chain, branched or cyclic alkyl group or fluoroalkyl group, and $R^4$ and $R^5$ may be bonded to each other to form a ring.)

Herein, $R^2$ is preferably a heat-labile protecting group shown in the specific examples, or of those a tertiary hydrocarbon group represented by $CR^{13}R^{14}R^{15}$—. It is particularly preferable that $R^3$ is a fluorine atom. Furthermore, it is preferable that the alkyl group or fluorine-containing alkyl group of $R^4$ and $R^5$ is a lower alkyl group or fluorine-containing lower alkyl group. It is preferable that the alkyl group is a cyclic alkyl group. Furthermore, it is preferable that $R^4$ is a hydrogen atom. As a particularly preferable one, it is possible to cite one in which $R^2$ is 1-methylcyclopentyl group or 1-ethylcyclopentyl group, $R^3$ is a fluorine atom, $R^4$ is a hydrogen atom or lower alkyl group, $R^5$ is a lower alkyl group, or $R^4$ or $R^5$ is an alicyclic hydrocarbon group formed by bonding each other.

<Fluorine-Containing Monomer>

The repeating unit represented by general formula (1) is formed by the production of a bivalent group through cleavage of the polymerizable double bond possessed by the corresponding fluorine-containing monomer. Therefore, the explanations conducted on the polymerizable double bond, from which the main chain constituting the fluorine-containing polymer, the polymerizable group containing it, each organic group ($R^1$, $R^3$, etc.), the linking group W, the heat-labile protecting group, etc. in <Fluorine-containing Polymer> can each be applied to those of the fluorine-containing monomer.

The process for producing the fluorine-containing monomer is not particularly limited. For example, it can be produced by using a process shown in the following reaction formula [1] to reaction formula [4] (see Japanese Patent Application Publication 2009-19199).

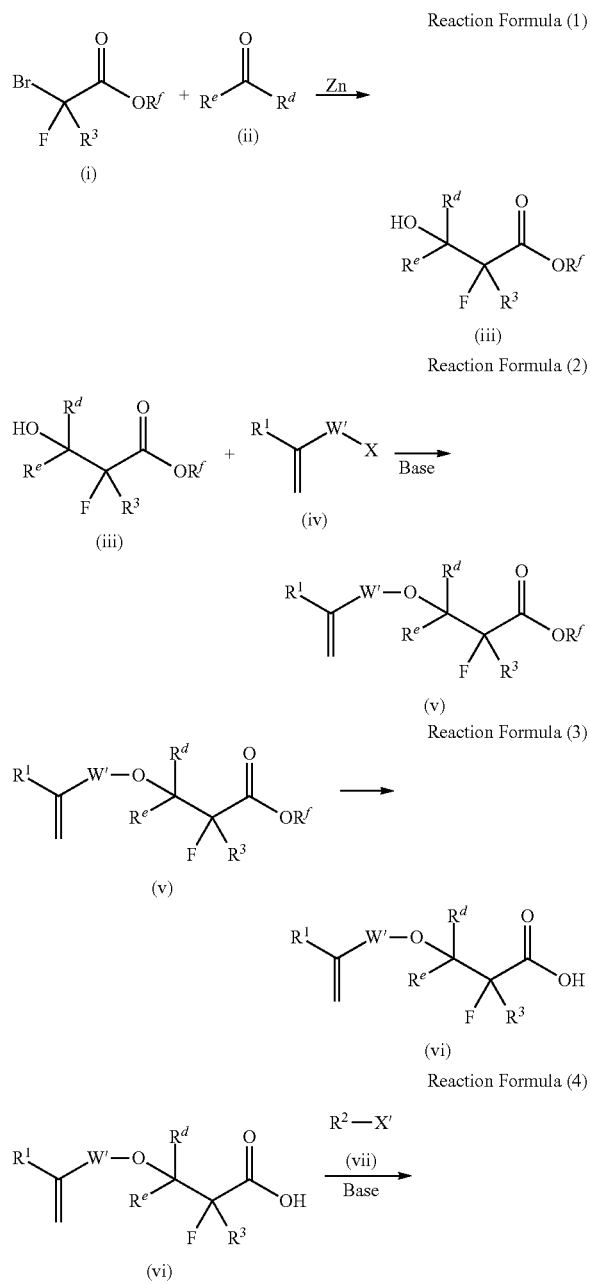

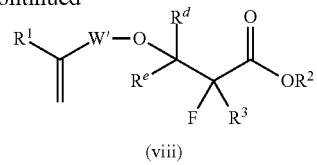

In the formulas, $R^1$, $R^2$ and $R^3$ have the same meanings of $R^1$, $R^2$ and $R^3$ in general formula (1). Each of $R^d$, $R^e$ and $R^f$ independently represents a monovalent organic group. $R^d$ may, however, be a hydrogen atom. $R^d$ or $R^e$ corresponds to $R^4$ or $R^5$ of general formula (2). Specific explanations of $R^d$, $R^e$ and $R^f$ are as mentioned above, but a lower alkyl group is preferable as a monovalent organic group. Specifically, there are more preferable methyl group, ethyl group, propyl group, butyl group, cyclopentyl group, cyclohexyl group, norbornyl group, adamantyl group, trifluoromethyl group, 2,2,2-trifluoroethyl group, 1-(trifluoromethyl)ethyl group, and 3,3,3-trifluoropropyl group, or a cyclopentyl group, cyclohexyl group, or cycloheptyl group, which is formed by bonding $R^4$ or $R^5$ together.

Each of X and X' independently represents a halogen atom, trifluoromethanesulfonate group, $C_{1-4}$ alkylsulfonate group or arylsulfonate group. W' represents a bivalent linking group. W'—O—$CR^dR^e$ corresponds to one mode of W in general formula (1).

At first, a halogen-containing carboxylic acid ester (i) having an active halogen atom at α-position is reacted with a carbonyl compound (ii) in the presence of zinc under an anhydrous condition (Reformatsky reaction), thereby obtaining a hydroxy carboxylic acid ester (iii) (reaction formula [1]). Then, the obtained hydroxy carboxylic acid ester (iii) is reacted in solvent with a halogen compound (iv) having a polymerizable double bond in the presence of a base, thereby obtaining an unsaturated carboxylic acid ester (v) (reaction formula [2]). Then, the obtained ester (v) is hydrolyzed to obtain an unsaturated carboxylic acid (vi) having a fluorine atom at α-position (reaction formula [3]). At last, the obtained unsaturated carboxylic acid (vi) is reacted in solvent with a halogen compound (vii) in the presence of a base, thereby obtaining a fluorine-containing compound (fluorine-containing monomer) represented by general formula (viii) (reaction formula [4]).

In general formula (viii), when W is expressed as W'—O—$CR^dR^e$, general formula (viii) represents one mode of general formula (1). It suffices that the solvent used in the method of the reaction of [1], [2] or [4] is not involved in the reaction in the reaction condition. Aliphatic hydrocarbons such as pentane, hexane and heptane; aromatic hydrocarbons such as benzene, toluene and xylene; nitriles such as acetonitrile, propionitrile, phenylacetonitrile, isobutyronitrile, and benzonitrile; acid amides such as dimethylformamide, dimethylacetamide, methylformamide, formamide, and hexamethylphosphoric triamide; lower ethers such as tetrahydrofuran, 1,2-dimethoxyethane, 1,4-dioxane, diethyl ether, 1,2-epoxyethane, 1,4-dioxane, dibutyl ether, tert-butyl methyl ether, and substituted tetrahydrofurans, etc. are used. Dimethylformamide and tetrahydrofuran are preferable. These solvents can also be used in combination. The amount of the solvent is about 1-100 parts by weight, preferably 1-10 parts by weight, relative to one part by weight of the starting material. It is preferable to remove water as much as possible from the solvent to be used in the reaction of [1]. More preferably, the water content of the solvent is 50 ppm or less.

It is also preferable to remove water as much as possible from the solvent to be used in the reaction of [2] or [4]. It is, however, not necessary to completely remove water. The water close to that generally contained in an industrially available solvent is not particularly problematic in conducting the present production method. Therefore, it can be used directly without removing water.

It is preferable to use the zinc used in the method of the reaction of [1] by activating it by a known method. For example, there are a method to obtain a metallic zinc by reducing a zinc salt, such as zinc chloride, with potassium, magnesium, lithium or the like; an activation method by treating metallic zinc with hydrochloric acid; a method for activating zinc by treating metallic zinc with a copper salt or silver salt in acetic acid to convert it into an alloy with copper or silver; a method for activating zinc by ultrasonic waves; a method for activating zinc by mixing zinc with chlorotrimethylsilane in ether; and a method for activating zinc by bringing zinc into contact with chlorotrimethylsilane and a copper compound in an aprotic organic solvent.

Zinc may have any form, such as powder, granule, aggregate, porous form, cutting scrap, or filament. The reaction temperature of the reaction [1] is about −78 to 120° C. Although the reaction time varies depending on the reaction agents, it is convenient in general to conduct that for about 10 minutes to 20 hours. It suffices that the reaction pressure is around ordinary pressure. The conditions of analogous reactions using metallic zinc publicly known to a person skilled in the art can be applied to other reaction conditions.

As the base in the reactions of [2] and [4], it is possible to cite organic bases, such as trimethylamine, triethylamine, diisopropylethylamine, tri-n-propylamine, tri-n-butylamine, dimethyllaurylamine, dimethylaminopyridine, N,N-dimethylaniline, dimethylbenzylamine, 1,8-diazabicyclo(5,4,0) undec-7-ene, 1,4-diazabicyclo(2,2,2)octane, pyridine, 2,4,6-trimethylpyridine, pyrimidine, pyridazine, 3,5-lutidine, 2,6-lutidine, 2,4-lutidine, 2,5-lutidine, 3,4-lutidine, etc. Of these, particularly triethylamine, diisopropylethylamine, dimethylaminopyridine, 1,8-diazabicyclo(5,4,0)undec-7-ene, pyridine, and 2,6-lutidine are preferable.

It suffices that the amount of the base used in the reaction of [2] or [4] is 1 mol or greater relative to 1 mol of the substrate. Generally, 1-10 mols is preferable, and particularly 1-5 mols is more preferable.

In the method of the reaction of [2] or [4], the reaction temperature is about −78 to 120° C. Although the reaction time varies depending on the reaction reagents, it is convenient to conduct that generally for about 10 minutes to 20 hours. The reaction pressure may be around ordinary pressure. Conditions known to a person skilled in the art can be applied to other reaction conditions.

The reaction of [3] is conducted by hydrolyzing that with water in the presence of the above-mentioned basic substance or an inorganic basic substance such as sodium hydroxide, potassium hydroxide, sodium carbonate, calcium hydroxide, etc. It is possible to conduct a purification operation, such as washing, separation of solvent, etc., and drying, in an interval of each reaction step of [1] to [4]. Furthermore, in case that a halogen-containing carboxylic acid ester having a heat-labile protecting group (that is, in case that $R^f$ of general formula (i) is $R^2$ of general formula (1)) is available, it is possible to obtain the target fluorine-containing compound represented by general formula (viii) by conducting the reaction formula [1] and the reaction formula [2].

<Other Monomers to be Used in Copolymerization>

The fluorine-containing polymer of the top coating composition of the present invention is one obtained by homopolymerization of the fluorine-containing monomer obtained by the method shown in the above-mentioned <fluorine-containing monomer> or by its copolymerization with another polymerizable monomer mentioned in the following. In the polymerization reaction, a skeleton of the fluorine-containing polymer is formed on the basis of a C—C double bond possessed by a double bond-containing group of the fluorine-containing polymer, but the rest of the structure does not change in the polymerization reaction.

As a monomer that is copolymerizable with the fluorine-containing compound (monomer) obtained by the method shown in the above-mentioned <Fluorine-containing Monomer> is specifically exemplified, it is possible to cite maleic anhydride, acrylic acid esters, fluorine-containing acrylic acid esters, methacrylic acid esters, fluorine-containing methacrylic acid esters, styrene compounds, fluorine-containing styrene compounds, vinyl ethers, fluorine-containing vinyl ethers, allyl ethers, fluorine-containing allyl ethers, olefins, fluorine-containing olefins, norbornene compounds, fluorine-containing norbornene compounds, sulfur dioxide, vinyl silanes, vinyl sulfonic acid, vinyl sulfonic acid esters, etc.

The above-mentioned polymerizable acrylic acid esters or methacrylic acid esters can be used without a particular limitation on the ester side chain. As publicly known compounds are shown as examples, it is possible to cite acrylic acid or methacrylic acid alkyl esters such as methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, n-hexyl acrylate, n-hexyl methacrylate, n-octyl acrylate, n-octyl methacrylate, 2-ethylhexyl acrylate, 2-ethylhexyl methacrylate, lauryl acrylate, lauryl methacrylate, 2-hydroxyethyl acrylate, 2-hydroxyethyl methacrylate, 2-hydroxypropyl acrylate and 2-hydroxypropyl methacrylate, diacrylates or dimethacrylates of ethylene glycol, propylene glycol and tetramethylene glycol, acrylic acid or methacrylic acid esters having an alkoxysilyl group, tert-butyl acrylate, tert-butyl methacrylate, 3-oxocyclohexyl acrylate, 3-oxocyclohexyl methacrylate, adamantyl acrylate, adamantyl methacrylate, methyladamantyl acrylate, methyladamantyl methacrylate, ethyladamantyl acrylate, ethyladamantyl methacrylate, hydroxyadamantyl acrylate, hydroxyadamantyl methacrylate, cyclohexyl acrylate, cyclohexyl methacrylate, tricyclodecanyl acrylate, tricyclodecanyl methacrylate, acrylates or methacrylates having a ring structure such as lactone ring and norbornene ring, etc. Furthermore, it is also possible to use unsaturated amides such as acrylamide, methacrylamide, N-methylolacrylamide, N-methylolmethacrylamide and diacetoneacrylamide, acrylonitrile, methacrylonitrile, etc.

Furthermore, the above-mentioned fluorine-containing acrylic acid ester or fluorine-containing methacrylic acid ester is a monomer in which a fluorine atom or fluorine-atom-containing group is bonded to α-position of acrylic acid, or an acrylic acid ester or methacrylic acid ester having at ester moiety a substituent having a fluorine atom. A fluorine-containing compound containing fluorine at both α-position and ester moiety is also preferable. Furthermore, a cyano group may be introduced into α-position. For example, as a monomer having a fluorine-containing alkyl group introduced into α-position, there is used a monomer in which a trifluoromethyl group, trifluoroethyl group, nonafluoro-n-butyl group or the like has been bonded to α-position of the above-mentioned non-fluorine series acrylic acid ester or methacrylic acid ester.

On the other hand, a monomer having fluorine at its ester moiety is an acrylic acid ester or methacrylic acid ester having a unit that is a perfluoroalkyl group or fluoroalkyl group at ester moiety, or a unit having both a cyclic structure and a fluorine atom, which is a unit having a fluorine-containing benzene ring, fluorine-containing cyclopentane ring, fluorine-containing cyclohexane ring or fluorine-containing cycloheptane ring formed by replacing a hydrogen atom of the cyclic structure with, for example, a fluorine atom, trifluoromethyl group, hexafluoroisopropyl hydroxy group or the like. It is also possible to use an acrylic acid or methacrylic acid ester having a fluorine-containing t-butyl group at ester moiety. As these fluorine-containing units, it is also possible to use monomers having a fluorine-containing alkyl group at α-position. Of such units, as particularly typical ones are exemplarily shown, it is possible to cite 2,2,2-trifluoroethylacrylate, 2,2,3,3-tetrafluoropropylacrylate, 1,1,1,3,3,3-hexafluoroisopropylacrylate, heptafluoroisopropylacrylate, 1,1-dihydroheptafluoro-n-butylacrylate, 1,1,5-trihydrooctafluoro-n-pentylacrylate, 1,1,2,2-tetrahydrotridecafluoro-n-octylacrylate, 1,1,2,2-tetrahydroheptadecafluoro-n-decylaciylate, 2,2,2-trifluoroethylmethacrylate, 2,2,3,3-tetrafluoropropylmethacrylate, 1,1,1,3,3,3-hexafluoroisopropylmethacrylate, heptafluoroisopropylmethacrylate, 1,1-dihydroheptafluoro-n-butylmethacrylate, 1,1,5-trihydrooctafluoro-n-pentylmethacrylate, 1,1,2,2-tetrahydrotridecafluoro-n-octylmethacrylate, 1,1,2,2-tetrahydroheptadecafluoro-n-decylmethacrylate, perfluorocyclohexylmethylacrylate, perfluorocyclohexylmethylmethacrylate, 6-[3,3,3-trifluoro-2-hydroxy-2-(trifluoromethyl)propyl]bicyclo[2.2.1]heptyl-2-yl acrylate, 6-[3,3,3-trifluoro-2-hydroxy-2-(trifluoromethyl)propyl]bicyclo[2.2.1]heptyl-2-yl 2-(trifluoromethyl) acrylate, 6-[3,3,3-trifluoro-2-hydroxy-2-(trifluoromethyl)propyl]bicyclo[2.2.1]heptyl-2-yl methacrylate, 1,4-bis(1,1,1,3,3,3-hexafluoro-2-hydroxyisopropyl)cyclohexylacrylate, 1,4-bis(1,1,1,3,3,3-hexafluoro-2-hydroxyisopropyl)cyclohexylmethacrylate, 1,4-bis(1,1,1,3,3,3-hexafluoro-2-hydroxyisopropyl)cyclohexyl 2-trifluoromethylacrylate, etc.

Furthermore, as a polymerizable monomer having a hexafluoroisopropyl hydroxy group, which is usable in the copolymerization, is specifically exemplified, it is possible to cite the following compounds. As a fluorine-containing copolymer containing a repeating unit represented by general formula (1), fluorine-containing copolymers containing repeating units obtained by cleavage of these polymerizable monomers having a hexafluoroisopropyl hydroxy group are particularly preferable since it is easy to keep a balance between water repellency and developing solution solubility.

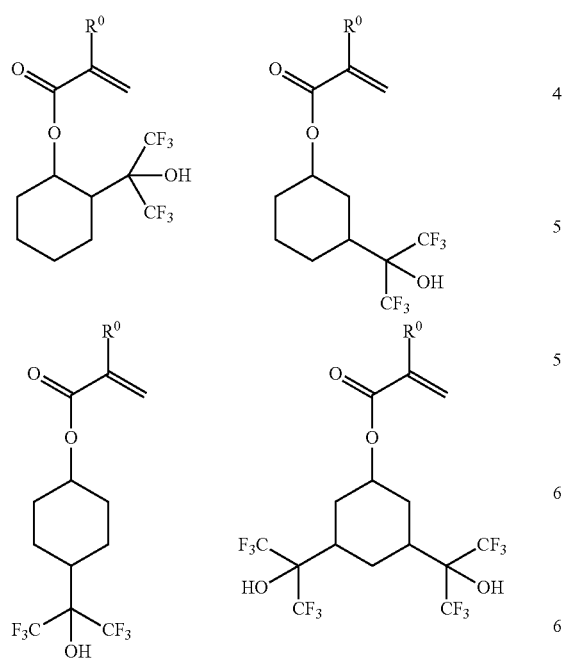

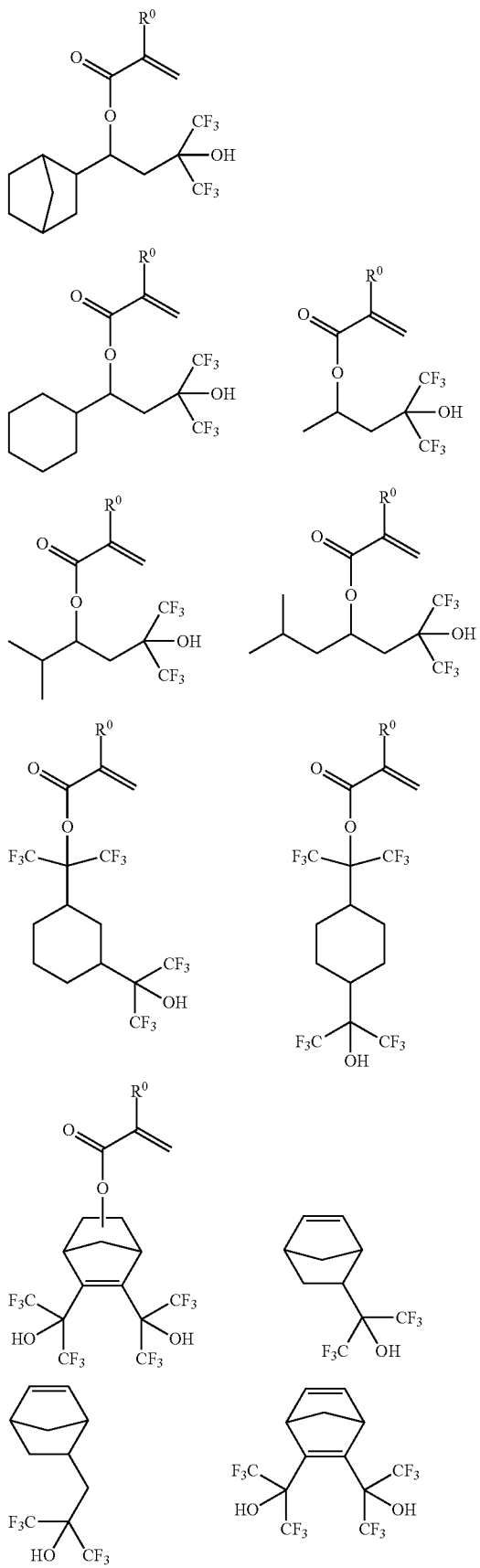

-continued

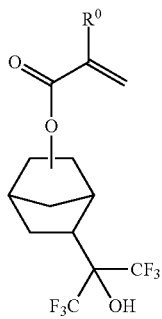 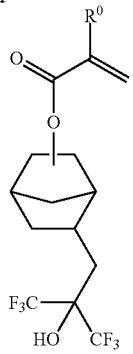

In this case, R⁰ represents a hydrogen atom, methyl group, fluorine atom, or trifluoromethyl group. Furthermore, in the case of having a plurality of hexafluoroisopropyl hydroxy groups, they may partially or entirely be protected with a protecting group such as a lower alkyl group (e.g., methyl group, ethyl group, cyclopropyl group, and cyclohexyl group).

Furthermore, as styrene compounds and fluorine-containing styrene compounds usable in the copolymerization, it is possible to cite styrene, fluorinated styrene, hydroxystyrene, etc. More specifically, it is possible to use a styrene in which hydrogen of the aromatic ring has been replaced with fluorine atom or trifluoromethyl group, such as pentafluorostyrene, trifluoromethylstyrene, bistrifluoromethylstyrene, etc., and a styrene in which hydrogen of the aromatic ring has been replaced with hexafluoroisopropyl hydroxy group or a functional group in which the hydroxy group has been protected. Furthermore, it is possible to use the above styrene in which halogen, alkyl group or fluorine-containing alkyl group has been bonded to α-position, a perfluorovinyl group-containing styrene, etc.

Furthermore, vinyl ether, fluorine-containing vinyl ether, allyl ether or fluorine-containing allyl ether usable in the copolymerization is an alkyl vinyl ether or alkyl allyl ether formed of methyl group, ethyl group, propyl group, butyl group, or a hydroxy group-containing alkyl group such as hydroxyethyl group or hydroxybutyl group, and a vinyl group or allyl group, or a vinyl ether or allyl ether having a cyclohexyl group, norbornyl group, aromatic ring, or a carbonyl bond in its cyclic structure, or a fluorine-containing vinyl ether or fluorine-containing allyl ether in which hydrogens of the functional group have partially or entirely been replaced with fluorine atom.

Vinyl esters, vinyl silanes, olefins, fluorine-containing olefins, norbornene compounds, fluorine-containing norbornene compounds, and compounds containing other polymerizable unsaturated bonds can also be used in the present invention without particular limitations.

The olefins usable in the copolymerization can be exemplified by ethylene, propylene, isobutene, cyclopentene, cyclohexene, etc., and the fluorine-containing olefins can be exemplified by vinyl fluoride, vinylidene fluoride, trifluoroethylene, chlorotrifluoroethylene, tetrafluoroethylene, hexafluoropropylene, hexafluoroisobutene, etc.

Norbornene compounds and fluorine-containing norbornene compounds, which are usable in the copolymerization, are norbornene monomers having a mononuclear or multinuclear structure. Upon this, they are norbornene compounds produced by Diels-Alder addition reaction between an unsaturated compound such as fluorine-containing olefin, allyl alcohol, fluorine-containing allyl alcohol, homoallyl alcohol, fluorine-containing homoallyl alcohol, acrylic acid, α-fluoroacrylic acid, α-trifluoromethylacrylic acid, methacrylic acid, 2-(benzoyloxy)pentafluoropropane, 2-(methoxyethoxymethyloxypentafluoropropene, 2-(tetrahydroxypyranyloxy)pentafluoropropene, 2-(benzoyloxy)trifluoroethylene, 2-(methoxymethyloxy)trifluoroethylene, or all of the acrylic acid esters, methacrylic acid esters, fluorine-containing acrylic acid esters or fluorine-containing methacrylic acid esters, etc. mentioned in the present specification, and cyclopentadiene or cyclohexadiene. They can be exemplified by 3-(5-bicyclo[2.2.1]hepten-2-yl)-1,1,1-trifluoro-2-(trifluoromethyl)-2-propanol, etc.

Furthermore, it is also possible to use an alkoxysilyl group-containing vinyl silane, acrylic acid, methacrylic acid, the above-mentioned acrylate compounds containing a cyano group at α-position, maleic acid, fumaric acid, maleic anhydride, etc.

The fluorine-containing polymer of the top coating composition of the present invention is decomposed by an action of heat or acid and thereby becomes soluble in an alkali developing solution. If it is necessary to further introduce a heat- or acid-labile protecting group into the system, it is easy to introduce a repeating unit having a heat- or acid-labile protecting group as a copolymerization component. As a method for introducing such repeating unit, there is preferably used a method of conducting a copolymerization with another polymerizable monomer having a heat- or acid-labile group.

Furthermore, as another method for obtaining a polymer or resist material having a heat- or acid-lability, it is also possible to conduct a method of later introducing a heat- or acid-labile protecting group into the previously obtained polymer or to mix a heat- or acid-labile compound in the form of a monomer or polymer.

The purpose of using a heat- or acid-labile protecting group is to reveal a positive-type photosensitivity by a heat- or acid-lability and a solubility in an alkali developing solution after exposure with an ultraviolet ray of a wavelength of 300 nm or less, excimer laser, a high-energy ray such as X-ray, or electron beams.

It is possible to use another polymerizable monomer that is copolymerizable and has a heat- or acid-lability usable in the present invention without a particular limitation, as long as it has a group that is released by the effect of photoacid generator, hydrolysis, etc. As it is exemplified, monomers having groups represented by the following general formulas (9) to (11) can preferably be used.

(9)

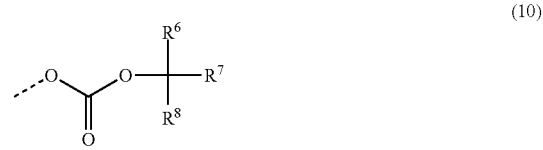

(10)

(11)

Herein, each of $R^6$, $R^7$, $R^8$, $R^9$, and $R^{10}$ is independently a $C_{1-25}$ straight-chain, branched, or cyclic alkyl group, and it may partially contain a fluorine atom, oxygen atom, nitrogen atom, sulfur atom or hydroxy group. Two of $R^4$, $R^5$ and $R^6$ may be bonded to form a ring.

As specific examples of the groups represented by general formulas (9) to (11), they can be exemplified by those shown in the following without a particular limitation.

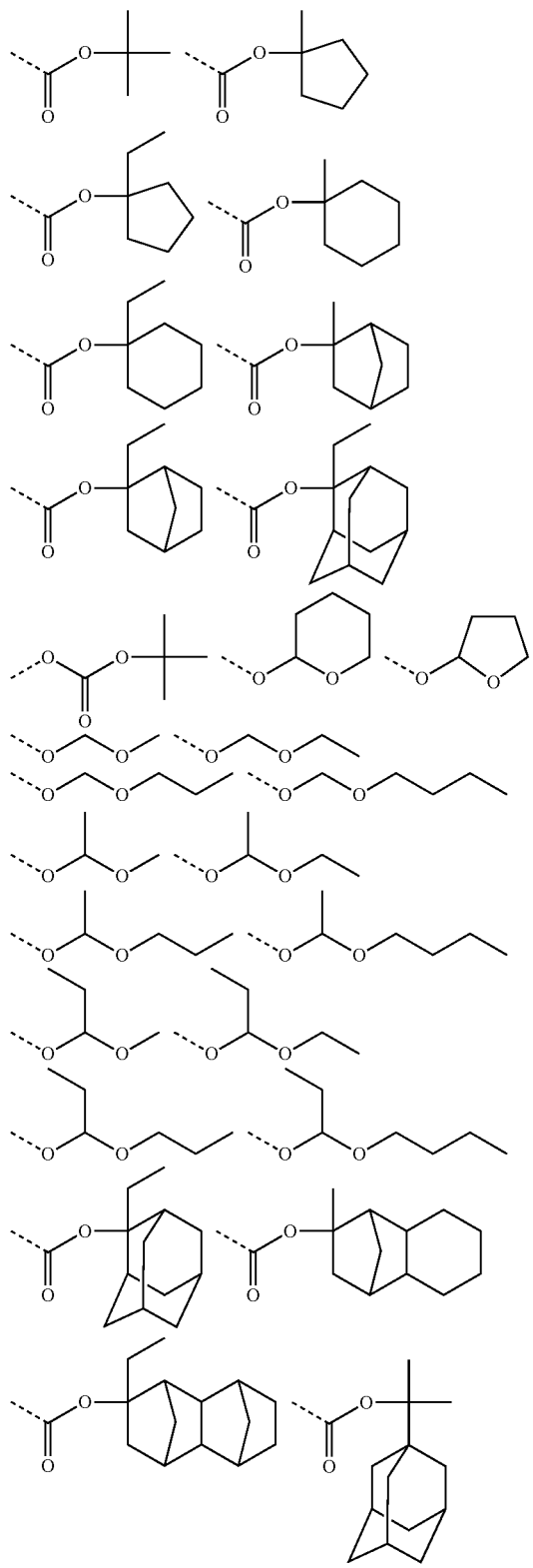

In the production of the fluorine-containing polymer of the top coating composition of the present invention, it is possible to introduce a unit containing a lactone structure for the purpose of improving adhesion with substrate. In introducing such unit, a lactone-containing cyclic polymer is preferably used. Such lactone-containing cyclic polymerizable monomer can be exemplified by a monocyclic lactone such as a group obtained by removing one hydrogen atom from γ-butyrolactone, and a polycyclic lactone such as a group obtained by removing one hydrogen atom from norbornanelactone. By containing a lactone structure in resist, not only adhesion with substrate is improved, but also compatibility with the developing solution can be increased.

Furthermore, the above-mentioned copolymerizable monomer usable in the present invention may be used singly or in combination of at least two types.

The fluorine-containing polymer of the present invention may be made up of a repeating unit composed of a plurality of monomers. Its proportion is set without a particular limitation. For example, the range shown in the following is preferably used.

The fluorine-containing polymer of the present invention contains a repeating unit represented by general formula (1) by 1-100 mol %, more preferably 5-90 mol %. The rest is the above-mentioned <other polymerizable monomers>. In case that the repeating unit represented by general formula (1) is less than 1 mol %, it is not preferable since the change of solubility in an alkali developing solution by exposure due to the use of the repeating unit represented by general formula (1) is too small.

As the fluorine-containing copolymer containing the repeating unit represented by general formula (1), fluorine-containing copolymers containing a repeating unit represented by general formula (1) exemplified as the most preferable ones mentioned above, and a repeating unit obtained by cleavage of a polymerizable monomer having the above-mentioned hexafluoroisopropyl hydroxy group are particularly preferable.

The method for polymerizing the fluorine-containing polymer of the top coating composition of the present invention is not particularly limited, as long as it is a method generally used. Radical polymerization, ion polymerization, etc. are preferable. In some cases, it is also possible to use coordination anion polymerization, living anion polymerization, cation polymerization, ring-opening metathesis polymerization, vinylene polymerization, etc.

The radical polymerization may be conducted by a known polymerization method, such as bulk polymerization, solution polymerization, suspension polymerization or emulsion polymerization, in the presence of a radical polymerization initiator or radical initiating source, with a batch-wise, half-continuous or continuous operation.

The radical polymerization initiator is not particularly limited. As the examples, azo compounds, peroxide compounds and redox compounds are cited. In particular, azobisisobutyronitrile, t-butylperoxypivalate, di-t-butylperoxide, i-butyrylperoxide, lauroylperoxide, succinic acid peroxide, dicinnamylperoxide, di-n-propylperoxydicarbonate, t-butylperoxyallyl monocarbonate, benzoyl peroxide, hydrogen peroxide, ammonium persulfate, etc. are preferable.

The reaction vessel used in the polymerization reaction is not particularly limited. Furthermore, a polymerization solvent may be used in the polymerization reaction. As the polymerization solvent, one that does not interfere with the radical polymerization is preferable. Representative ones are ester solvents such as ethyl acetate and n-butyl acetate, ketone solvents such as acetone and methyl isobutyl ketone, hydrocarbon solvents such as toluene and cyclohexane, alcohol solvents such as methanol, isopropyl alcohol and ethylene glycol monomethyl ether, etc. Furthermore, it is also possible to use various solvents such as water, ethers, cyclic ethers, fluorohydrocarbons, and aromatics. These solvents can be used singly or in a mixture of at least two types. Furthermore, it may be accompanied in use with a molecular weight adjusting agent such as mercaptan. The reaction temperature of the copolymerization reaction is suitably changed, depending on the radical polymerization initiator or radical polymerization initiating source. Normally, 20-200° C. is preferable. In particular, 30-140° C. is preferable.

On the other hand, in ring-opening metathesis polymerization, a transition metal catalyst of Groups 4-7 can be used in the presence of a cocatalyst, and a publicly known method can be used in the presence of a solvent.

The polymerization catalyst is not particularly limited. As the examples, Ti series, V series, Mo series and W series catalysts are cited. In particular, titanium (IV) chloride, vanadium (IV) chloride, vanadium trisacetylacetonato, vanadium bisacetylacetonatodichloride, molybdenum (VI) chloride, tungsten (VI) chloride, etc. are preferable. The amount of the catalyst is from 10 mol % to 0.001 mol %, preferably 1 mol % to 0.01 mol %, relative to the monomer used.

As the cocatalyst, alkylaluminum, alkyltin, etc. are cited. In particular, it can be exemplified by aluminum series such as trialkylaluminums such as trimethylaluminum, triethylaluminum, tripropylaluminum, triisopropylaluminum, triisobutylaluminum, tri-2-methylbutylaluminum, tri-3-methylbutylaluminum, tri-2-methylpentylaluminum, tri-3-methylpentylaluminum, tri-4-methylpentylaluminum, tri-2-methylhexylaluminum, tri-3-methylhexylaluminum, and trioctylaluminum; dialkylaluminum halides such as dimethylaluminum chloride, diethylaluminum chloride, diisopropylaluminum chloride, and diisobutylaluminum chloride; monoalkylaluminum halides such as methylaluminum dichloride, ethylaluminum dichloride, ethylaluminum diiodide, propylaluminum dichloride, isopropylaluminum dichloride, butylaluminum dichloride, and isobutylaluminum dichloride; and alkylaluminum sesquichlorides such as methylaluminum sesquichloride, ethylaluminum sesquichloride, propylaluminum sesquichloride; and isobutylaluminum sesquichloride; tetra-n-butyltin, tetraphenyltin, and triphenylchlorotin. The amount of the cocatalyst is by molar ratio a range of 100 equivalents or less, preferably of 30 equivalents or less, relative to the transition metal catalyst.

The polymerization solvent will do, as long as it does not interfere with the polymerization reaction. As representative ones, it can be exemplified by aromatic hydrocarbon series such as benzene, toluene, xylene, chlorobenzene and dichlorobenzene; hydrocarbon series such as hexane, heptane and cyclohexane; and halogenated hydrocarbons such as carbon tetrachloride, chloroform, methylene chloride and 1,2-dichloroethane. These solvents can be used singly or in a mixture of at least two kinds. The reaction temperature is generally preferably −70 to 200° C., particularly preferably −30 to 60° C.

The vinylene polymerization can be conducted in the presence of a cocatalyst by using a transition metal catalyst of Groups 8-10, such as iron, nickel, rhodium, palladium and platinum, or a metal catalyst of Groups 4-6, such as zirconium, titanium, vanadium, chromium, molybdenum, and tungsten. It can be conducted by a publicly known method in the presence of a solvent.

The polymerization catalyst is not particularly limited. As examples, particularly, there are preferable transition metals of Groups 8-10, such as iron(II) chloride, iron(III) chloride, iron(II) bromide, iron(III) bromide, iron(II) acetate, iron(III) acetylacetonato, ferrocene, nickelocene, nickel(II) acetate, nickel bromide, nickel chloride, dichlorohexylnickel acetate, nickel lactate, nickel oxide, nickel tetrafluoroborate, bis(allyl)nickel, bis(cyclopentadienyl)nickel, nickel(II) hexafluoroacetylacetonatotetrahydrate, nickel(II) trifluoroacetylacetonatodihydrate, nickel(II) acetylacetonatotetrahydrate, rhodium(III) chloride, rhodium tris(triphenylphosphine) trichloride, palladium(II) bis(trifluoroacetate), palladium(II) bis(acetylacetonato), palladium(II) 2-ethylhexanoate, palladium(II) bromide, palladium(II) chloride, palladium(II) iodide, palladium(II) oxide, monoacetonitriletris(triphenylphosphine)palladium(II) tretrafluoroborate, tetrakis(acetonitrile)palladium(II) tetrafluoroborate, dichlorobis(acetonitrile)palladium(II), dichlorobis(triphenylphosphine) palladium, dichlorobis(benzonitrile)palladium(II), palladium acetylacetonato, palladium bis(acetonitrile) dichloride, palladium bis(dimethylsulfoxide)dichloride and platinum bis(triethylphosphine)hydrobromide, and transition metals of Groups 4-6, such as vanadium(IV) chloride, vanadium trisacetylacetonato, vanadium bisacetylacetonatodichloride, trimethoxy(pentamethylcyclopentadienyl)titanium(IV), bis(cyclopentadienyl)titanium dichloride, and bis(cyclopentadienyl)zirconium dichloride. The amount of the catalyst is from 10 mol % to 0.001 mol %, preferably from 1 mol % to 0.01 mol %, relative to the monomer used.

As the cocatalyst, alkylaluminoxane, alkylaluminum, etc. are cited. In particular, it can be exemplified by methylaluminoxane (MAO), trialkylaluminums such as trimethylaluminum, triethylaluminum, tripropylaluminum, triisopropylaluminum, triisobutylaluminum, tri-2-methylbutylaluminum, tri-3-methylbutylaluminum, tri-2-methylpentylaluminum, tri-3-methylpentylaluminum, tri-4-methylpentylaluminum, tri-2-methylhexylaluminum, tri-3-methylhexylaluminum, and trioctylaluminum; dialkylaluminum halides such as dimethylaluminum chloride, diethylaluminum chloride, diisopropylaluminum chloride, and diisobutylaluminum chloride; monoalkylaluminum halides such as methylaluminum dichloride, ethylaluminum dichloride, ethylaluminum diiodide, propylaluminum dichloride, isopropylaluminum dichloride, butylaluminum dichloride, and isobutylaluminum dichloride; and alkylaluminum sesquichlorides such as methylaluminum sesquichloride, ethylaluminum sesquichloride, propylaluminum sesquichloride, and isobutylaluminum sesquichloride. The amount of the cocatalyst is 50 to 500 equivalents in terms of Al in the case of methylaluminoxane. In the case of other alkylaluminums, it is a range of 100 equivalents or less, preferably of 30 equivalents or less, relative to the transition metal catalyst by molar ratio.

The polymerization solvent will do as long as it does not interfere with the polymerization reaction. As representative ones, it can be exemplified by aromatic hydrocarbon series such as benzene, toluene, xylene, chlorobenzene, and dichlorobenzene; hydrocarbon series such as hexane, heptane, and cyclohexane; halogenated hydrocarbon series such as carbon tetrachloride, chloroform, methylene chloride, and 1,2-dichloroethane; dimethylformamide, N-methylpyrrolidone, and N-cyclohexylpyrrolidone. Furthermore, these solvents may be used singly or in a mixture of at least two kinds. The reaction temperature is generally preferably −70 to 200° C., particularly preferably −40 to 80° C.

As a method of removing an organic solvent or water as a medium from the thus obtained solution or dispersion of the fluorine-containing polymer of the present invention, any of publicly known methods can be used. As it is exemplified, there are methods such as reprecipitation and filtration, or heating distillation under reduced pressure.

As number average molecular weight of the fluorine-containing polymer of the top coating composition of the present invention, generally a range of 1,000 to 100,000, preferably 3,000 to 50,000, is appropriate.

In the use as a top coating, solubility and casting characteristics can be changed depending on the molecular weight. A polymer with a high molecular weight becomes slow in the rate of dissolution in the developing solution. In the case of being low in molecular weight, the rate of dissolution becomes fast. It is controllable by a suitable adjustment.

A top coating composition of the present invention is used in the form of a top coating solution (top coating composition solution) in which the fluorine-containing polymer of the present invention is dissolved in an organic solvent or in a mixed solvent of at least two organic solvents as a solvent. It is preferable that the solvent to be used is a solvent that scarcely corrodes the resist film of the underlayer and scarcely leaches an additive such as photoacid generator from the resist film.

As such organic solvent, although depending on the resist film composition of the underlayer, it is possible to cite various hydrocarbon series, alcohol series, ether series, ester series, and fluorine series organic solvents.

Of these, one selected from the group consisting of $C_{5-20}$ alkanes (saturated aliphatic hydrocarbons) or cycloalkanes (alicyclic hydrocarbons), $C_{1-20}$ hydrocarbon series alcohols, or ones in which an arbitrary number of hydrogen atoms of these alkanes, cycloalkanes or hydrocarbon series alcohols has been replaced with fluorine atom, or a mixed solvent of at least two thereof is preferable.

More preferably, one selected from the group consisting of $C_{5-10}$ alkanes (saturated aliphatic hydrocarbons) or cycloalkanes (alicyclic hydrocarbons), $C_{1-10}$ hydrocarbon series alcohols, or ones in which an arbitrary number of hydrogen atoms of these alkanes, cycloalkanes or hydrocarbon series alcohols has been replaced with fluorine atom, or a mixed solvent of at least two thereof is preferable.

Furthermore, it is preferable that the solvent or mixed solvent is one having a boiling point range of 70 to 170° C. When applying the top coating composition onto the resist film by spin coating, the evaporation becomes too fast with a boiling point lower than 70° C., thereby not forming a homogeneous film. Exceeding 170° C., it takes time to dry the coating film, thereby lowering throughput. Therefore, it is not preferable.

For example, a solvent prepared by mixing 50 to 99.9% of a $C_{5-20}$ hydrocarbon and 0.1% to 50% of a $C_{1-20}$ hydrocarbon series alcohol is preferable, and it is more preferable to have 50 to 99.9% of a $C_{5-10}$ hydrocarbon and 0.1% to 50% of a $C_{1-10}$ hydrocarbon series alcohol.

As specific preferable organic solvents to be used singly or to be used as a mixed solvent, hydrocarbon series solvents that are alkanes or cycloalkanes comprising pentane, hexane, heptane, octane, nonane, decane, etc. and their isomers (containing cyclic compounds); hydrocarbon series alcohols such as butanols (normal, iso and tertiary), methyl ethyl carbinol, pentanol, amyl alcohol, hexyl alcohol, heptyl alcohol, 4-methyl-2-pentanol, etc.; and more preferably hydrocarbon series solvents prepared by a partial replacement with fluorine are preferably used. As the hydrocarbon series solvents prepared by a partial replacement with fluorine, it is possible to use ones in which a part of hydrogen atoms of the above-mentioned alkanes, cycloalkanes or hydrocarbon series alcohols has been replaced with fluorine atom. By introducing fluorine atom, it is possible to effectively dissolve the fluorine-containing polymer of the present invention and to conduct a coating giving no damage on the underlayer resist film.

The amount of the solvent for mixing is not particularly limited, since it depends on the film forming conditions and since the preparation is conducted to form a predetermined film thickness. It is used such that preferably the solid matter concentration of the top coating solution becomes 3-25%, more preferably 5-15%. By adjusting the solid matter concentration of the top coating solution, it is possible to adjust the film thickness of the resin film to be formed.

Furthermore, in the present invention, it is possible to preferably use a hydrophobic additive for suppressing the effect on swelling or infiltration of water, an acidic additive for accelerating solubility in the developing solution, an acid generator that does not decompose at the prebaking temperature or lower, but decomposes at the post-exposure baking temperature, etc.

The wavelength to be used in the exposure is not limited, but as mentioned above it is possible to use a high energy ray of 300 nm or less. It is possible to preferably use KrF excimer laser (248 nm), ArF excimer laser (193 nm), $F_2$ laser (157 nm), EUV, EB, and X-ray. In particular, ArF excimer laser is preferably used. Furthermore, the top coating of the present invention is preferably applied in immersion lithography.

The thickness of the top coating film formed from the top coating solution of the present invention is not particularly limited. It is 10-1000 nm, and 20-200 nm is preferable. It is also possible to use a solvent that is used in the top coating solution, for removing the top coating film from the exposed resist film, but it is preferable to conduct the dissolution removal (exfoliation) together with a soluble portion of the resist film by a substantially single operation with the developing solution of the resist.

In the top coating of the present invention, since the heat-labile protecting group of the carboxylic acid of the fluorine-containing polymer constituting the top coating is released by the heat treatment conducted in the step of the post-exposure baking (PEB) after the resist exposure, it is possible to increase solubility of the top coating in the developing solution by the heat treatment as a turning point. The heat treatment temperature depends on the temperature at which the heat-labile protecting group attached to the carboxylic acid moiety is released, but it can be conducted in a range of 60° C. to 170° C. It is possible to easily exfoliate the top coating film comprising the top coating composition of the present invention by the alkali developing solution after PEB. The rate of dissolution is generally 50-3000 nm/second, and 100-1000 nm/second is preferable. If it is less than 50 nm/second, it takes time for the treatment. If it exceeds 3000 nm/second, the dissolution does not become homogeneous, and dissolution and removal of the resist become inhomogeneous. Therefore, either is not preferable.

Furthermore, it is possible to use the top coating composition of the present invention by blending it with a top coating resin that is generally used in the immersion lithography use. It is desirable that such top coating resin is soluble in the above-mentioned hydrocarbon series, alcohol series, ether series, ester series, and fluorine series organic solvents. Furthermore, there is preferable a mixing with a top coating resin of a type (a so-called developing solution soluble type) that removes it simultaneously with the development by an alkali developing solution upon the development. The proportion of the mixing depends on properties of other top coating resins, too. It is possible to mix 10-80%, preferably 10-50%, of the weight of the fluorine-containing polymer of the present invention. Since the top coating composition of the present invention is superior in water repellency, it is possible to make a top coating composition that is improved in water repellency, as compared with a case of singly using another top coating resin.

Furthermore, as mentioned above, since it becomes soluble in the alkali developing solution by a heat treatment of the post-exposure baking (PEB), even a top coating formed by the mixing can be dissolved in the alkali developing solution with no problem via PEB after immersion exposure.

In the following, there is explained a pattern forming method in the case of using a top coating composition of the present invention in the device production using immersion lithography. The pattern forming method of the present invention is a pattern forming method characterized by containing the step of applying a top coating composition of the present invention onto a resist film, the step of conducting an exposure with a high-energy ray having a wavelength of 300 nm or less through a photomask, and the step of conducting a development by using a developing solution after the heating treatment.

Firstly, a resist composition solution is applied onto a silicon wafer or a support of a semiconductor production substrate by a spinner or the like, followed by conducting a prebaking to form a resist layer. It is possible to suitably set the conditions of this step, depending on the composition of the resist composition to be used. For example, it can be conducted at 80-150° C., preferably 90-120° C., for 30-120 seconds, preferably 60-90 seconds.

Then, a top coating composition solution of the present invention is uniformly applied by a spinner or the like onto the surface of the resist film formed as mentioned above, followed by conducting a heat treatment (prebaking), thereby forming a resin film made of a two-layer film in which the resist layer is coated with the top coating layer. It is possible to suitably set the conditions of this step, depending on the composition of the resist composition and the top coating composition solution to be used. It is conducted at lower than thermal decomposition temperature of the heat-labile protecting group. That is, temperature of the prebaking is lower than thermal decomposition temperature of the heat-labile group, and it is conducted at 50-100° C., preferably 60-90° C., for 10-120 seconds, preferably 30-90 seconds. Furthermore, it is preferable to conduct that at a temperature lower than drying of the resist film A medium such as water is placed on the substrate on which this two-layer or multilayer resin layer has been formed, followed by irradiation with a high-energy ray of 300 nm or less through a desired mask pattern. Upon this, exposure passes through the medium (e.g., water) and the top coating layer and reaches the resist layer. Furthermore, since the resist layer is separated from the medium (e.g., water) by the top coating layer, the medium (e.g., water) does not swell the resist layer by immersion, nor does the resist dissolves into the medium (e.g., water).

Next, the exposed substrate is subjected to the post-exposure baking. By conducting the post-exposure baking at the thermal decomposition temperature of the heat-labile protecting group or higher, the protecting group is released. Therefore, it becomes soluble in the alkali developing solution. Then, a development treatment is conducted by using a developing solution, for example, an alkali aqueous solution such as 0.1-10 mass % tetramethylammonium hydroxide aqueous solution. In the development treatment, firstly, the top coating layer is fully dissolved, and then the resist film of the exposed portion is dissolved. That is, it is possible to dissolve and remove the top coating layer and a portion of the resist layer by a single development treatment, and it is possible to obtain a resist pattern corresponding to a desired mask pattern.

EXAMPLES

In the following, the present invention is explained in detail by citing examples. The present invention is, however, not limited to the following examples.

Example 1-1

Method for Producing 2,2-difluoro-3-hydroxypentanoic acid ethyl ester

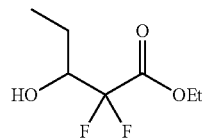

A 500 mL reactor was charged with 24.2 g (370 mmol/1.5 equivalents) of an activated metal zinc and 300 mL of THF (dehydrated), and thereto an ethyl bromodifluoroacetate/THF solution [51.47 g (253.6 mmol/1.0 equivalent) of ethyl bromodifluoroacetate and 80 mL of THF (dehydrated)] was added dropwise. After the dropping, stirring was conducted at room temperature for 20 minutes. Then, a propionaldehyde/THF solution [14.80 g (254.8 mmol/1.0 equivalent) of propionaldehyde and 80 mL of THF (dehydrated)] was added, followed by stirring at room temperature for 30 minutes. Then, water and diisopropyl ether were added to conduct a two-layer separation. The obtained organic layer was washed with diluted hydrochloric acid and water, followed by removing water by magnesium sulfate, conducting a filtration, and distilling diisopropyl ether out, thereby obtaining 41.2 g of the target 2,2-difluoro-3-hydroxypentanoic acid ethyl ester. Upon this, yield was 89%.

[Properties of 2,2-difluoro-3-hydroxypentanoic acid ethyl ester]

$^1$H NMR (CDCl$_3$) d 4.31 (q, J=7.1 Hz, 2H; CH$_2$—O), 3.89 (m, 1H; CH—OH), 2.50 (br, 1H; OH), 1.71 (m, 1H), 1.52 (m, 1H), 1.32 (t, J=7.1 Hz, 3H; CH$_3$), 1.02 (t, J=7.3 Hz, 3H; CH$_3$)

$^{19}$F NMR (CDCl$_3$) d −115.26 (d, J=252 Hz, 1F), −122.95 (d, J=252 Hz, 1F).

Example 1-2

Method for Producing methacrylic acid 1-ethoxycarbonyl-1,1-difluoro-2-butyl ester

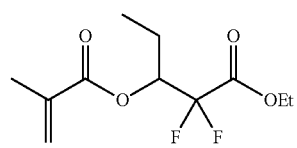 [SMILES: C=C(C)C(=O)OC(CC)C(F)(F)C(=O)OCC]

A 300 mL reactor was charged with 18.0 g (98.4 mmol) of 2,2-difluoro-3-hydroxypentanoic acid ethyl ester, 78 g of chloroform, 120 mg of an antioxidant NONFLEX MBP (a product of Seiko Chemical Co., Ltd.), 12.4 g (118.8 mmol/1.2 equivalents) of methacrylic acid chloride, and 15.0 g (148.8 mmol/1.5 equivalents) of triethylamine, followed by stirring at 55° C. for 4 hours. Then, 120 g of water was added, followed by extraction with chloroform one time. The obtained organic layer was washed with diluted hydrochloric acid and water, followed by removing water with magnesium sulfate, conducting a filtration, and distilling chloroform out, thereby obtaining 24.7 g of the target methacrylic acid 1-ethoxycarbonyl-1,1-difluoro-2-butyl ester. Upon this, purity was 66%, and yield was 66%.

Properties of methacrylic Acid 1-ethoxycarbonyl-1,1-difluoro-2-butyl ester $^1$H NMR (CDCl$_3$) d 6.14 (s, 1H; methylene), 5.62 (s, 1H; methylene), 5.35 (m, 1H; CH—O), 4.27 (m, 2H; CH$_2$—O), 1.93 (s, 3H; CH$_3$), 1.81 (m, 2H; CH$_2$), 1.28 (t, J=7.2 Hz, 3H; CH$_3$), 0.95 (t, J=7.6 Hz, 3H; CH$_3$)

$^{19}$F NMR (CDCl$_3$) d −113.63 (d, J=264 Hz, 1F), −119.57 (d, J=264 Hz, 1F).

Example 2

Method for Producing methacrylic acid 1-hydroxycarbonyl-1,1-difluoro-2-butyl ester

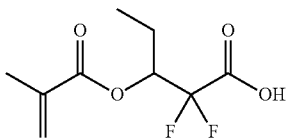

A 2 L reactor was charged with 80.0 g (purity 66%), 208 mmol) of methacrylic acid 1-ethoxycarbonyl-1,1-difluoro-2-butyl ester and 80.0 g of water, followed by cooling down to 0° C., adding dropwise 84.8 g (320 mmol/1.5 equivalents) of 15 wt % sodium hydroxide aqueous solution, and stirring at room temperature for 1 hour. The reaction liquid was washed with 800 g of diisopropyl ether. The obtained aqueous layer was washed with diluted hydrochloric acid, followed by extraction with diisopropyl ether two times, removing water by magnesium sulfate, conducting filtration, and distilling diisopropyl ether out, thereby obtaining 15.2 g of the target methacrylic acid 1-hydroxycarbonyl-1,1-difluoro-2-butyl ester.

Properties of methacrylic acid 1-hydroxycarbonyl-1,1-difluoro-2-butyl ester $^1$H NMR (CDCl$_3$) d 7.24 (br, 1H; COOH), 6.16 (s, 1H; methylene), 5.63 (s, 1H; methylene), 5.39 (m, 1H; CH—O), 1.93 (s, 3H; CH$_3$), 1.85 (m, 2H; CH$_2$), 0.97 (t, J=7.6 Hz, 3H; CH$_3$)
$^{19}$F NMR (CDCl$_3$) d −114.24 (d, J=264 Hz, 1F), −119.48 (d, J=264 Hz, 1F).

Example 3

Method for Producing methacrylic acid 1-(1-methylcyclopentyloxycarbonyl)-1,1-difluoro-2-butyl ester

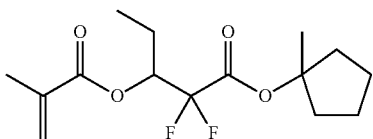 [SMILES: C=C(C)C(=O)OC(CC)C(F)(F)C(=O)OC1(C)CCCC1]

A 2 L reactor was charged under nitrogen with 7.0 g (purity 78%, 25 mmol) of methacrylic acid 1-hydroxycarbonyl-1,1-difluoro-2-butyl ester and 300 mL of THF (dehydrated), followed by cooling down to 0° C., adding 6.5 mL (47 mmol/1.9 equivalents) of triethylamine, and stirring at 0° C. for 10 minutes. Then, furthermore 4.7 g (40.0 mmol/1.6 equivalents) of 1-chloro-1-methylcyclopentane was added, followed by stirring at 0° C. for 20 minutes. To the reaction liquid 500 mL of water was added, followed by extraction two times with diisopropyl ether, removing water by magnesium sulfate, conducting a filtration, and distilling diisopropyl ether out, thereby obtaining 6.6 g of the target methacrylic acid 1-(1-methylcyclopentyloxycarbonyl)-1,1-difluoro-2-butyl ester. Upon this, purity was 96%, and yield was 83%.

Properties of methacrylic acid 1-(1-methylcyclopentyloxycarbonyl)-1,1-difluoro-2-butyl ester $^1$H NMR (measurement solvent: deuterated chloroform, standard substance: tetramethylsilane); δ=6.14 (s, 1H; =CH$_2$), 5.61 (s, 1H; =CH$_2$), 5.35 (m, 1H; CH—O), 2.09 (m, 2H; cyclopentyl moiety), 1.92 (s, 3H; CH$_3$—C), 1.82 (m, 2H; CH—CH$_2$CH$_3$), 1.67 (m, 6H; cyclopentyl moiety), 1.53 (s, 3H; COO—C—CH$_3$), 0.94 (t, J=7.6 Hz, 3H; CH—CH$_2$CH$_3$).
$^{19}$F NMR (measurement solvent: deuterated chloroform, standard substance: trichlorofluoromethane); δ=−113.20 (d, J=262 Hz, 1F), −119.65 (d, J=262 Hz, 1F).

Example 4

Method for Producing methacrylic acid 1-(1-ethylcyclopentyloxycarbonyl)-1,1-difluoro-2-butyl ester

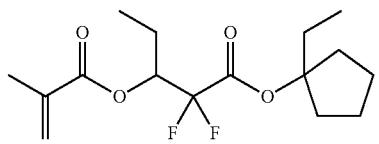 [SMILES: C=C(C)C(=O)OC(CC)C(F)(F)C(=O)OC1(CC)CCCC1]

A 2 L reactor was charged under nitrogen with 5.6 g (purity 78%, 20.0 mmol) of methacrylic acid 1-hydroxycarbonyl-1,1-difluoro-2-butyl ester and 240 mL of THF (dehydrated), followed by cooling down to 0° C., adding 5.2 mL (37.6 mmol/1.9 equivalents) of triethylamine, and stirring at 0° C. for 10 minutes. Then, furthermore 14.24 g (3.2 mmol/1.6 equivalents) of 1-chloro-1-ethylcyclopentane was added, followed by stirring at 0° C. for 20 minutes. To the reaction liquid 800 mL of water was added, followed by extraction two times with diisopropyl ether, removing water by magnesium sulfate, conducting a filtration, and distilling diisopropyl ether out, thereby obtaining 5.52 g of the target methacrylic acid 1-(1-ethylcyclopentyloxycarbonyl)-1,1-difluoro-2-butyl ester. Upon this, purity was 96%, and yield was 83%.

Properties of methacrylic acid 1-(1-ethylcyclopentyloxycarbonyl)-1,1-difluoro-2-butyl ester $^1$H NMR (measurement solvent: deuterated chloroform, standard substance: tetramethylsilane); δ=6.15 (s, 1H; =CH$_2$), 5.61 (s, 1H; =CH$_2$), 5.35 (m, 1H; CH—O), 2.08 (m, 2H; cyclopentyl moiety), 2.02 (q, J=7.6 Hz, 2H; COO—C—CH$_2$CH$_3$), 1.93 (s, 3H; CH$_3$—C), 1.82 (m, 2H; CH—CH$_2$CH$_3$), 1.62 (m, 6H; cyclopentyl moiety), 0.94 (t, J=7.6 Hz, 3H; COO—C—CH$_2$CH$_3$), 0.84 (t, J=7.6 Hz, 3H; CH—CH$_2$CH$_3$).
$^{19}$F NMR (measurement solvent: deuterated chloroform, standard substance: trichlorofluoromethane); δ=−112.93 (d, J=262 Hz, 1F), −118.80 (d, J=262 Hz, 1F).

Example 5

Synthesis of Fluorine-Containing Polymer

A fluorine-containing polymer was synthesized by a method described in the following example. Besides, molecular weight (weight average molecular weight Mw) and molecular weight dispersion (the ratio of Mw to number average molecular weight Mn; Mw/Mn) of the polymer were calculated by gel permeation chromatography (GPC, standard substance: polystyrene). GPC machine: HLC-8320GPC made by Tosoh Corporation
Column used: ALPHA-M column (one) and ALPHA-2500 column (one) made by Tosoh Corporation were used by connecting them in series.
Development solvent: tetrahydrofuran
Detector: refractive index detector Example 5-1

Synthesis Example 1 of Fluorine-Containing Polymer Resin (Fluorine-containing polymer compound (1): MA-PFA-MCP/MA-MIB-HFA=75/25 copolymerization system)

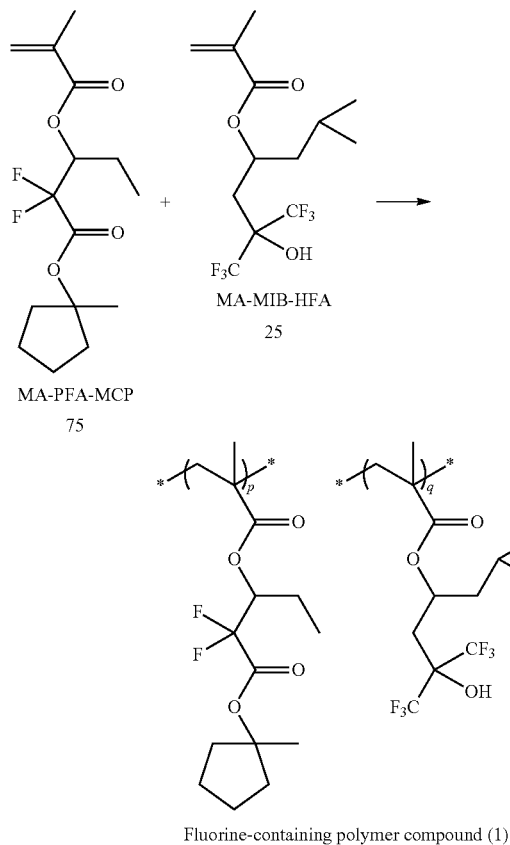

Fluorine-containing polymer compound (1)

In a glass flask, 1.46 g (4.80 mmol) of MA-PFA-MCP and 0.54 g (1.60 mmol) of MA-MIB-HFA were dissolved in 6.01 g of 2-butanone. To this solution, 0.061 g (0.25 mmol) of a polymerization initiator p-PV (product name t-butylperoxypivalate, made by NOF CORPORATION) was added. With stirring, deaeration was conducted. After introducing nitrogen gas, the reaction was conducted at 60° C. for 20 hours. The solution after the reaction was concentrated. Then, while stirring the concentrated solution, n-heptane (300 g) was added gradually. The obtained precipitate was dried, thereby obtaining 1.61 g of a white-color solid (the fluorine-containing polymer compound (1)) (yield 80%). The compositional ratio of the repeating unit was determined in NMR, and the molecular weight was calculated by gel permeation chromatography (GPC, standard substance: polystyrene). The results are shown in Table 1.

Example 5-2

Synthesis Example 2 of Fluorine-Containing Polymer Resin (Fluorine-containing polymer compound (2): MA-PFA-MCP/MA-MIB-HFA=50/50 copolymerization system)

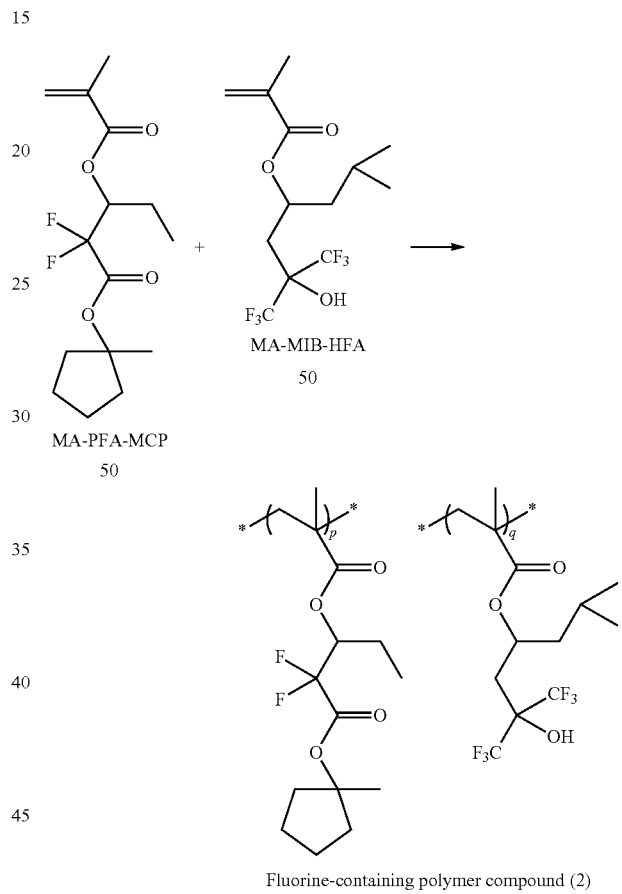

Fluorine-containing polymer compound (2)

In a glass flask, 0.95 g (3.12 mmol) of MA-PFA-MCP and 1.05 g (3.12 mmol) of MA-MIB-HFA were dissolved in 6.00 g of 2-butanone. To this solution, 0.077 g (0.31 mmol) of a polymerization initiator p-PV (product name t-butylperoxypivalate, made by NOF CORPORATION) was added. With stirring, deaeration was conducted. After introducing nitrogen gas, the reaction was conducted at 60° C. for 20 hours. The solution after the reaction was concentrated. Then, while stirring the concentrated solution, n-heptane (300 g) was added gradually. The obtained precipitate was dried, thereby obtaining 1.72 g of a white-color solid (the fluorine-containing polymer compound (2)) (yield 86%). The compositional ratio of the repeating unit was determined in NMR, and the molecular weight was calculated by gel permeation chromatography (GPC, standard substance: polystyrene). The results are shown in Table 1.

Example 5-3

Synthesis Example 3 of Fluorine-Containing Polymer Resin (Fluorine-containing polymer compound (3): MA-PFA-MCP/MA-MIB-HFA=25/75 copolymerization system)

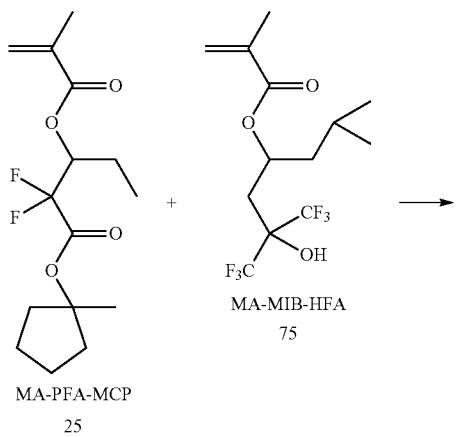

In a glass flask, 0.46 g (1.52 mmol) of MA-PFA-MCP and 1.54 g (4.57 mmol) of MA-MIB-HFA were dissolved in 6.00 g of 2-butanone. To this solution, 0.060 g (0.24 mmol) of a polymerization initiator p-PV (product name t-butylperoxypivalate, made by NOF CORPORATION) was added. With stirring, deaeration was conducted. After introducing nitrogen gas, the reaction was conducted at 60° C. for 20 hours. The solution after the reaction was concentrated. Then, while stirring the concentrated solution, n-heptane (300 g) was added gradually. The obtained precipitate was dried, thereby obtaining 1.75 g of a white-color solid (the fluorine-containing polymer compound (3)) (yield 87%). The compositional ratio of the repeating unit was determined in NMR, and the molecular weight was calculated by gel permeation chromatography (GPC, standard substance: polystyrene). The results are shown in Table 1.

Example 5-4

Synthesis Example 4 of Fluorine-Containing Polymer Resin (Fluorine-containing polymer compound (4): MA-PFA-ECP/MA-MIB-HFA=50/50 copolymerization system)

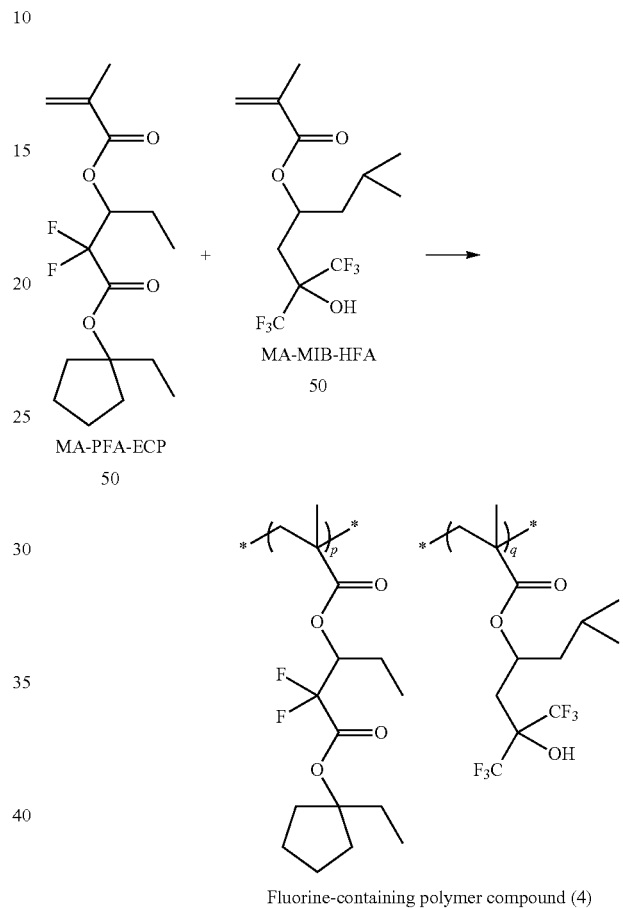

In a glass flask, 0.98 g (3.09 mmol) of MA-PFA-ECP and 1.03 g (3.06 mmol) of MA-MIB-HFA were dissolved in 6.00 g of 2-butanone. To this solution, 0.060 g (0.24 mmol) of a polymerization initiator p-PV (product name t-butylperoxypivalate, made by NOF CORPORATION) was added. With stirring, deaeration was conducted. After introducing nitrogen gas, the reaction was conducted at 60° C. for 20 hours. The solution after the reaction was concentrated. An organic two-layer washing was conducted with n-heptane (20.0 g) and methanol (4.10 g). The solvent was distilled out, thereby obtaining 1.47 g of a white-color solid (the fluorine-containing polymer compound (4)) (yield 73%). The compositional ratio of the repeating unit was determined in NMR, and the molecular weight was calculated by gel permeation chromatography (GPC, standard substance: polystyrene). The results are shown in Table 1.

Besides, it was confirmed that the fluorine-containing polymer compounds (1) to (4) are soluble in a weak solvent, 4-methyl-2-pentanol (MIBC).

TABLE 1

| Example | Polymer compound | Mw (Mw/Mn) | Monomers | Molar compositional ratio |
|---|---|---|---|---|
| Example 5-1 | Fluorine-containing polymer compound (1) | 17,400 (2.09) | MA-PFA-MCP/ MA-MIB-HFA | 68/32 (75/25) |
| Example 5-2 | Fluorine-containing polymer compound (2) | 12,400 (2.51) | MA-PFA-MCP/ MA-MIB-HFA | 42/58 (50/50) |
| Example 5-3 | Fluorine-containing polymer compound (3) | 20,500 (2.59) | MA-PFA-MCP/ MA-MIB-HFA | 23/77 (25/75) |
| Example 5-4 | Fluorine-containing polymer compound (4) | 6,400 (2.22) | MA-PFA-ECP/ MA-MIB-HFA | 36/64 (50/50) |

In Table, the compositional ratio of the preparation is shown in the parenthesis of the column of molar compositional ratio.

Example 6

Top Coating Test

Preparation of Top Coating Application Liquid

Fluorine-containing polymer compounds (1) to (4) synthesized by Example 5 were each dissolved in MIBC. A preparation was conducted such that the solid matter became 5%. Each one was obtained as a homogeneous, transparent, polymer solution (top coating solution).

Production of Top Coating Film

Each top coating solution was filtered by a membrane filter (0.2 μm). Then, it was added dropwise on a silicon wafer previously treated with an oxide film, followed by a spin coating by using a spinner at a rotation speed of 1,500 rpm and then drying on a hot plate at lower than 60° C. for 60 seconds, thereby obtaining a uniform resin film.

Measurement of Receding Contact Angle

By using an apparatus CA-X type made by Kyowa Interface Science Co., Ltd., the receding contact angle was measured by an expansion and contraction method.

Alkali Developing Solution Solubility Test

Alkali developing solution solubility of a top coating resin film heated at each temperature for 180 seconds was examined. The test was conducted by an immersion at 23° C. for 1 minute by using a 2.38% alkali developing solution (tetramethylammonium hydroxide aqueous solution). The results are shown in Table 2.

TABLE 2

| | | | Developing solution solubility | | | |
|---|---|---|---|---|---|---|
| Example | Top coating polymer compound | Receding contact angle (°) | Prior to heat treatment | 90° C. | 120° C. | 130° C. |
| Example 6-1 | Fluorine-containing polymer compound (1) | 78 | Insoluble | Insoluble | Soluble | Soluble |
| Example 6-2 | Fluorine-containing polymer compound (2) | 78 | Insoluble | Insoluble | Soluble | Soluble |
| Example 6-3 | Fluorine-containing polymer compound (3) | 81 | Insoluble | Insoluble | Insoluble | Soluble |
| Example 6-4 | Fluorine-containing polymer compound (4) | 75 | Insoluble | Soluble | Soluble | Soluble |

With a higher receding contact angle, fewer droplets remain even if conducting a high-speed scanning exposure. From the results of Table 2, the top coating films of the present invention containing the fluorine-containing polymer compounds (1) to (4) showed high receding contact angles.

Furthermore, the top coating films of the present invention prior to the heat treatment were insoluble in the alkali developing solution. However, when conducting a heat treatment at 120-130° C., the protecting group was released, and a good developing solution solubility was shown. Furthermore, the top coating film containing the polymer compound (4) using MA-PFA-ECP showed solubility, even if the heat treatment temperature was a relatively low temperature.

Reference Example 1

Synthesis of Resist Polymer (Resist Polymer: Resist-1)

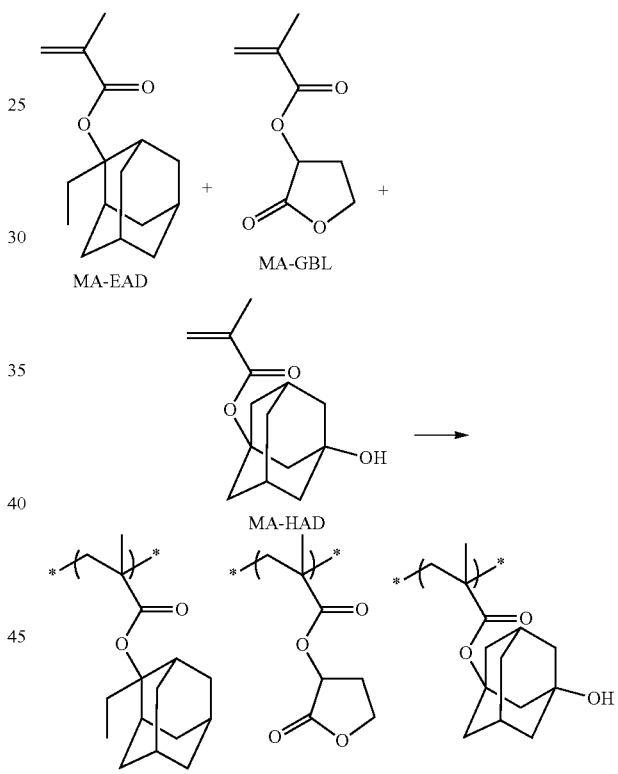

In a glass flask, 13.4 g (54.1 mmol) of ethyl adamantyl methacrylate (MA-EAD), 6.95 g (40.8 mmol) of γ-butyrolactone methacrylate (MA-GBL), and 9.60 g (40.6 mmol) of hydroxyadamantyl methacrylate (MA-HAD) were dissolved in 30.0 g of 2-butanone. To this solution, 0.58 g (2.86 mmol) of n-dodecyl mercaptan (made by Tokyo Chemical Industry Co., Ltd.) and 1.31 g (5.34 mmol) of a polymerization initiator p-PV (product name t-butylperoxypivalate, made by NOF CORPORATION) were added. With stirring, deaeration was conducted. After introducing nitrogen gas, the reaction was conducted at 75° C. for 16 hours. The solution after the reaction was added to 618 g of n-heptane, thereby obtaining a white-color precipitate. This precipitate was separated by filtration, followed by conducting a drying under reduced pressure at 40° C., thereby obtaining 27.4 g of a white-color solid (yield 91%). GPC measurement results; Mn=7,400, Mw/Mn=2.13

Reference Example 2

Resist Solution

A resist solution (Resist-1 Solution) was prepared by dissolving the resist polymer obtained by Reference Example 1 in propylene glycol monomethyl ether acetate to have a solid matter content of 5%.

Example 7

Using Resist-1 Solution prepared by Reference Example 2 and the top coating solution containing as a major component the fluorine-containing polymer compound (3) prepared by Example 5, a resin film made up of two-layer film, a resist layer and a top coating layer, was formed on a silicon wafer by a process shown in the following.

Resin Film Forming Process

Resist-1 Solution obtained by Reference Example 2 was added dropwise onto a silicon wafer, followed by a spin coating at 1,500 rpm by using a spinner and then drying on a hot plate at 110° C. for 60 seconds, thereby obtaining a resist film having a film thickness of 112 nm. On this resist film, a top coating solution filtered by a membrane filter (0.2 µm) was added dropwise, followed by a spin coating at 1,500 rpm by using a spinner and then drying on a hot plate at 130° C. for 180 seconds, thereby forming a resin film (a two-layer film made up of a resist layer and a top coating layer) having a thickness of 242 nm.

A development was conducted at 23° C. for 1 minute by using a 2.38% alkali developing solution (tetramethylammonium hydroxide aqueous solution). With this, the film thickness became 112 nm. The top coating layer was completely dissolved in the developing solution, and only the resist layer remained without dissolution.

Reference Example 3

Resist Composition

A preparation was conducted by dissolving the resist polymer obtained by Reference Example 1 in propylene glycol monomethyl ether acetate to have a solid matter content of 5%. Furthermore, triphenylsulfonium nonafluorobutanesulfonate as an acid generator (PAG) to become 5 parts by weight relative to 100 parts by weight of the polymer and isopropanol amine as a base to become 2 parts by weight relative to the same were dissolved, thereby preparing a resist solution (hereinafter referred to as Resist-2).

Example 8 and Comparative Example 1

Using Resist-1 Solution prepared by Reference Example 2 and a top coating solution containing as a major component a fluorine-containing polymer compound (1) to (4) prepared by Example 5, a resin film made up of a two-layer film of a resist layer and a top coating layer was formed on a silicon wafer by a process shown in the following.

The obtained resin films were each subjected to pure water immersion test (PAG bleaching evaluation) and exposure resolution test. The results are shown in Table 3.

Resin Film Forming Process

Resist-2 Solution obtained by Reference Example 3 was added dropwise onto a silicon wafer, followed by a spin coating at 1,500 rpm by using a spinner and then drying on a hot plate at 110° C. for 60 seconds, thereby obtaining a resist film having a film thickness of 100 to 150 nm. On this resist film, a top coating solution filtered by a membrane filter (0.2 µm) was added dropwise, followed by a spin coating at 1,500 rpm by using a spinner and then drying on a hot plate at 60° C. for 60 seconds, thereby forming a resin film (a two-layer film made up of a resist layer and a top coating layer) having a thickness of 200 to 300 nm. As Comparative Example 1, a sample with only a resist film by not forming a top coating film was prepared by the same method.

Pure Water Immersion Test

Silicon wafers having resin films formed thereon, obtained by the above method, were each immersed in 20 mL of pure water to extract dissolved matters. Then, the extract was measured by ion chromatography to check the existence of dissolved matters. Except one (Comparative Example 1) with no use of top coating, peaks belonging to the photoacid generator and its decomposed matter were not observed. This indicates that dissolution of the resist components from the resist film to water is suppressed by the formation of the top coating. The results are shown in Table 3.

Exposure Test

Similar to the above, a silicon wafer, on which a resin film had been formed by applying a top coating solution onto the resist layer, was subjected to a prebaking at 110° C. for 60 seconds. Then, using water as medium, an immersion exposure to a 193 nm ultraviolet ray was conducted through a photomask of a 130 nm-size, 1:1 line-and-space (130 nm1L/1S pattern). While the wafer after the exposure was rotated, pure water was added dropwise for 2 minutes. Then, a post exposure baking was conducted at 130° C. for 180 seconds, thereby pyrolyzing (releasing) the heat-laible protecting group of the top coating. Then, a development was conducted at 23° C. for 1 minute by using a 2.38% alkali developing solution (tetramethylammonium hydroxide aqueous solution). As a result, a high-resolution pattern was obtained from each resist film having thereon a top coating. There were not found inferiority defect in adhesion to substrate, film-forming inferiority defect, development defect, and etching resistance inferiority defect.

The cross section of the obtained pattern was observed by a scanning electron microscope to observe the pattern shape. The evaluation of the pattern shape at that time is shown in Table 3.

TABLE 3

| Example | Resist Composition | Top Coating Polymer Compound | Pure Water Immersion Test | Pattern Shape |
|---|---|---|---|---|
| Example 8-1 | Resist-1 | Fluorine-containing Polymer Compound (1) | ○ | Rectangular Shape |
| Example 8-2 | Resist-1 | Fluorine-containing Polymer Compound (2) | ○ | Rectangular Shape |
| Example 8-3 | Resist-1 | Fluorine-containing Polymer Compound (3) | ○ | Rectangular Shape |
| Example 8-4 | Resist-1 | Fluorine-containing Polymer Compound (4) | ○ | Rectangular Shape |
| Com. Ex. 1 | Resist-1 | No Top Coating | X | Swelled |

Pure Water Immersion Test Results: One with no detection of the dissolved PAG was judged as "○", and one with detection was judged as "X".

From the results of Table 3, the pattern shapes of the resin films using the fluorine-containing polymer compounds (1) to (4) as the top coatings became rectangular. On the other hand, in a system with no use of top coating, the resist surface swelled, and thereby a good pattern was not obtained.

The invention claimed is:

1. A pattern forming method, comprising the sequential steps of:
    (a) applying a top coating composition on a resist layer to form a two-layer resin film having a top coating layer on the resist layer, the top coating composition consisting essentially of a fluorine-containing polymer and an organic solvent, the fluorine-containing polymer having a first repeating unit represented by the following general formula (1),

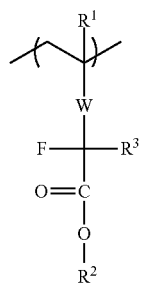

(1)

wherein $R^1$ represents a hydrogen atom, fluorine atom, methyl group or trifluoromethyl group, $R^2$ represents a heat-labile protecting group, $R^3$ represents a fluorine atom or fluorine-containing alkyl group, and W is a bivalent linking group,
and a second repeating unit obtained by a cleavage of a polymerizable double bond of a polymerizable monomer having a hexafluoroisopropyl hydroxyl group;
    (b) conducting an exposure of the two-layer resin film to a high-energy ray having a wavelength of 300 nm or shorter through a photomask;
    (c) conducting a heating treatment on the two-layer resin film; and
    (d) conducting a development of the two-layer resin film by using a developing solution.

2. A pattern forming method according to claim 1, wherein the heating treatment after the exposure is conducted at 60° C. to 170° C.

3. A pattern forming method according to claim 1, which is conducted by an immersion lithography method in which an Ar excimer laser having a wavelength of 193 nm is used, and in which water is inserted between wafer and projector lens.

4. A pattern forming method according to claim 1, wherein $R^3$ is a fluorine atom or $C_{1-3}$ fluorine-containing alkyl group.

5. A pattern forming method according to claim 1, wherein the first repeating unit is a repeating unit represented by any one of the following general formulas (1-1) to (1-4), (1-1)

(1-2)

(1-3)

(1-4)

wherein $R^2$ represents a heat-labile protecting group, $R^3$ represents a fluorine atom or trifluoromethyl group, $R^4$ represents a hydrogen atom, or a straight-chain, branched or cyclic alkyl group or fluoroalkyl group, $R^5$ represents a straight-chain, branched or cyclic alkyl group or fluoroalkyl group, and $R^4$ and $R^5$ may be bonded to each other to form a ring.

6. A pattern forming method according to claim 5, wherein $R^2$ is 1-methylcyclopentyl group or 1-ethylcyclopentyl group, $R^3$ is a fluorine atom, $R^4$ is a hydrogen atom, and $R^5$ is a lower alkyl group.

7. A pattern forming method according to claim 1, wherein the organic solvent of the top coating composition is a solvent comprising at least one selected from the group consisting of $C_{5-20}$ cyclic or chain hydrocarbons, $C_{1-20}$ alcohols, and $C_{5-20}$ cyclic or chain hydrocarbons partially replaced with fluorine.

* * * * *